United States Patent
An et al.

(10) Patent No.: US 12,495,543 B2
(45) Date of Patent: Dec. 9, 2025

(54) METHOD FOR MANUFACTURING SEMICONDUCTOR MEMORY DEVICE

(71) Applicant: SAMSUNG ELECTRONICS CO., LTD., Suwon-si (KR)

(72) Inventors: Ho Kyun An, Hwaseong-si (KR); Su Min Cho, Seoul (KR); Bum Soo Kim, Gwacheon-si (KR); Ha Young Kim, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 629 days.

(21) Appl. No.: 17/929,270

(22) Filed: Sep. 1, 2022

(65) Prior Publication Data

US 2023/0200059 A1    Jun. 22, 2023

(30) Foreign Application Priority Data

Dec. 20, 2021    (KR) .................. 10-2021-0182310

(51) Int. Cl.
*H10B 12/00* (2023.01)

(52) U.S. Cl.
CPC ............. *H10B 12/50* (2023.02); *H10B 12/09* (2023.02); *H10B 12/315* (2023.02)

(58) Field of Classification Search
CPC ........... H01L 21/76224; H01L 21/0206; H01L 21/76232; H01L 21/30604; H10D 64/513; H10D 62/115; H10D 84/0188; H10D 84/0151

See application file for complete search history.

(56) References Cited

U.S. PATENT DOCUMENTS

| | | | |
|---|---|---|---|
| 6,967,147 B1 | 11/2005 | Tews et al. | |
| 7,163,871 B2 | 1/2007 | Kubota et al. | |
| 7,968,442 B2 | 6/2011 | Kang et al. | |
| 9,559,193 B2 | 1/2017 | Isobe et al. | |
| 10,204,809 B2 | 2/2019 | Ruffell et al. | |
| 2014/0167177 A1* | 6/2014 | Kim | H10D 84/038 |
| | | | 257/369 |
| 2018/0175143 A1* | 6/2018 | Yoon | H10D 64/513 |
| 2018/0350905 A1* | 12/2018 | Yoon | H01L 21/76232 |

(Continued)

FOREIGN PATENT DOCUMENTS

| | | |
|---|---|---|
| JP | 2007-081057 | 3/2007 |
| KR | 10-2004-0069 | 7/2004 |

*Primary Examiner* — Edward Chin
(74) *Attorney, Agent, or Firm* — MORGAN, LEWIS & BOCKIUS LLP

(57) ABSTRACT

A method for manufacturing a semiconductor memory device comprises providing a substrate, etching a portion of the substrate that forms a trench therein, forming an element isolation film that fills the trench and defines an active area, herein the element isolation film includes a first liner that covers an inner sidewall and a bottom surface of the trench, wherein the first liner is recessed and exposes a corner portion of the substrate, doping nitrogen into the substrate, and forming a pre-gate insulating film that extends along and on the exposed corner portion of the substrate and an upper surface of the substrate. The pre-gate insulating film includes a first portion on the upper surface of the substrate, and a second portion on the corner portion of the substrate. A thickness of the first portion is less than a thickness of the second portion.

20 Claims, 33 Drawing Sheets

(56) References Cited

U.S. PATENT DOCUMENTS

2020/0312845 A1\* 10/2020 Yoon .................. H10D 84/85
2023/0200059 A1\* 6/2023 An ..................... H10B 12/50
　　　　　　　　　　　　　　　　　　　　　438/253

\* cited by examiner

FIG. 28
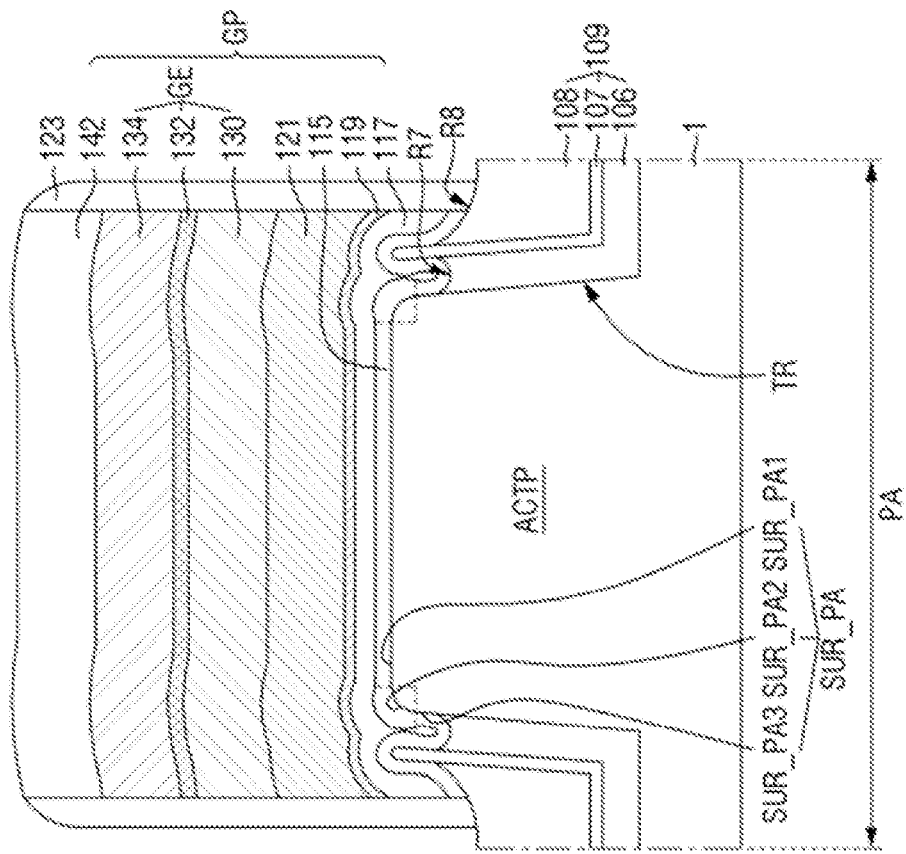
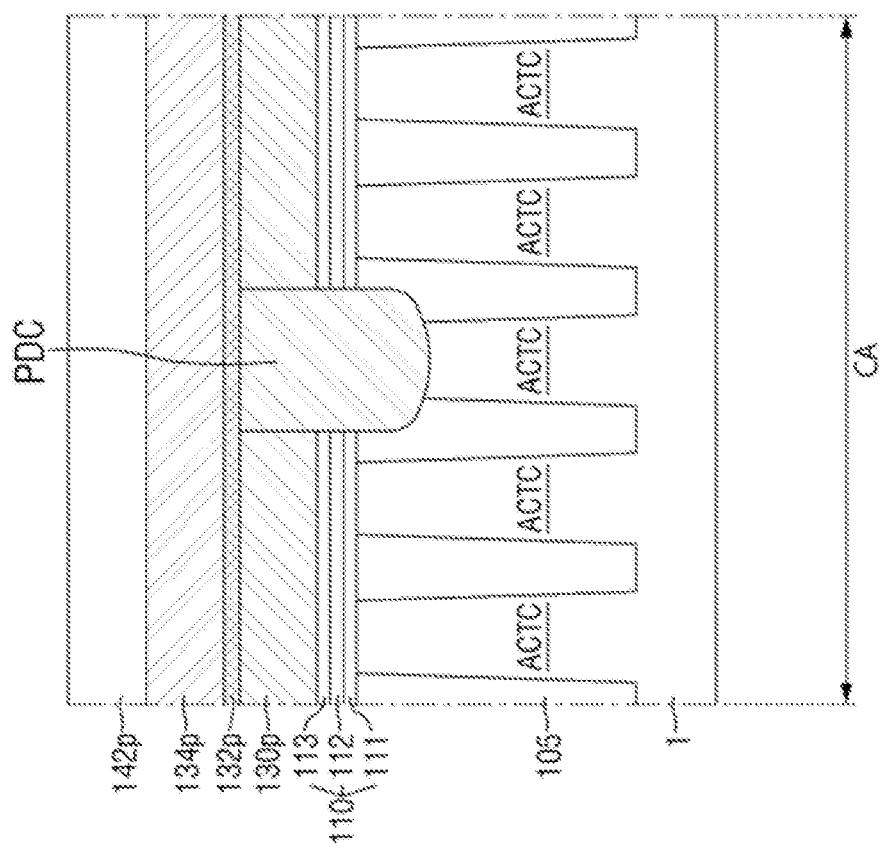

METHOD FOR MANUFACTURING SEMICONDUCTOR MEMORY DEVICE

CROSS-REFERENCE TO RELATED APPLICATION

This application claims priority under 35 U.S.C. 119 from Korean Patent Application No. 10-2021-0182310, filed on Dec. 20, 2021 in the Korean Intellectual Property Office, the contents of which are herein incorporated by reference in their entirety.

TECHNICAL FIELD

Embodiments of the present disclosure are directed to a method for manufacturing a semiconductor memory device.

DISCUSSION OF THE RELATED ART

A semiconductor memory element such as DRAM has a cell area and a peripheral region. In particular, the peripheral region includes an area in which a PMOS transistor is formed and an area in which an NMOS transistor is formed. Recently, a structure in which a p-type gate is disposed in the area where the PMOS transistor is formed and an n-type gate is disposed in the area where the NMOS transistor is formed is used.

Further, as an integration density of the semiconductor memory element increases, leakage current through a gate dielectric film of a transistor increases. In particular, as a thickness of a gate insulating film at a corner portion of an active area is small, a semiconductor memory device with reduced reliability may be manufactured. For example, due to differences in oxidation rate, a thickness of a gate oxide in a top portion is greater than a thickness of the gate oxide in a corner portion.

SUMMARY

Embodiments of the present disclosure provide a method for manufacturing a semiconductor memory device with increased reliability.

According to an embodiment of the present disclosure, there is provided a method for manufacturing a semiconductor memory device. The method includes providing a substrate, etching a portion of the substrate that forms a trench therein, forming an element isolation film that fills the trench and defines an active area, where the element isolation film includes a first liner that coves an inner sidewall and a bottom surface of the trench, where the first liner is recessed and exposes a corner portion of the substrate, doping nitrogen into the substrate, and forming a pre-gate insulating film that extends along and on the exposed corner portion of the substrate and an upper surface of the substrate. The pre-gate insulating film includes a first portion on the upper surface of the substrate, and a second portion on the corner portion of the substrate. A thickness of the first portion is less than a thickness of the second portion.

According to another embodiment of the present disclosure, there is provided a method for manufacturing a semiconductor memory device. The method includes providing a substrate that includes a first region and a second region, forming a first element isolation film that fills a first trench in the first region of the substrate and defines a first active area, where the first element isolation film includes a first liner that covers an inner sidewall and a bottom surface of the first trench, forming a second element isolation film that fills a second trench in the second region of the substrate and defines a second active area, where the second element isolation film includes a second liner that covers an inner sidewall and a bottom surface of the second trench, recessing the first liner and exposing a first corner portion in the first region of the substrate, and recessing the second liner and exposing a second corner portion in the second region of the substrate, doping nitrogen onto an entire surface of the substrate, forming a first pre-gate insulating film that extends along and on a first upper surface and the first corner portion in the first region of the substrate, and forming a second pre-gate insulating film that extends along and on a second upper surface and the second corner portion in the second region of the substrate. A thickness of the first pre-gate insulating film is greater than a thickness of the second pre-gate insulating film. The first pre-gate insulating film includes a first portion on the first upper surface and a second portion on the first corner portion, and a thickness of the first portion is less than a thickness of the second portion. The second pre-gate insulating film includes a third portion on the second upper surface and a fourth portion on the second corner portion, and a thickness of the third portion is less than a thickness of the fourth portion.

According to another embodiment of the present disclosure, there is provided a method for manufacturing a semiconductor memory device. The method includes providing a substrate that includes a cell array region and a peripheral region, forming a cell element isolation film in the cell array region of the substrate that defines a cell active area, forming a peripheral element isolation film that fills a peripheral trench in the peripheral region of the substrate and that defines a peripheral active area, wherein the peripheral element isolation film includes a peripheral liner that covers an inner sidewall and a bottom surface of the peripheral trench, forming a cell huller film on the cell array region of the substrate, doping nitrogen onto the peripheral region of the substrate, forming a pre-peripheral gate insulating film in the peripheral region of the substrate, forming a bit-line on the cell buffer film, where the bit-line extends across the cell array region of the substrate, and recessing the peripheral liner and exposing a corner portion of the peripheral region of the substrate in, wherein the pre-peripheral gate insulating film includes a first portion on an upper surface of the peripheral region of the substrate, and a second portion on the corner portion of the peripheral region of the substrate. A thickness of the first portion is less than a thickness of the second portion.

BRIEF DESCRIPTION OF DRAWINGS

FIG. 16 to FIG. 30 illustrate intermediate steps of a method for manufacturing, a semiconductor memory device according to embodiments of the present disclosure.

DETAILED DESCRIPTIONS

Figure 1:
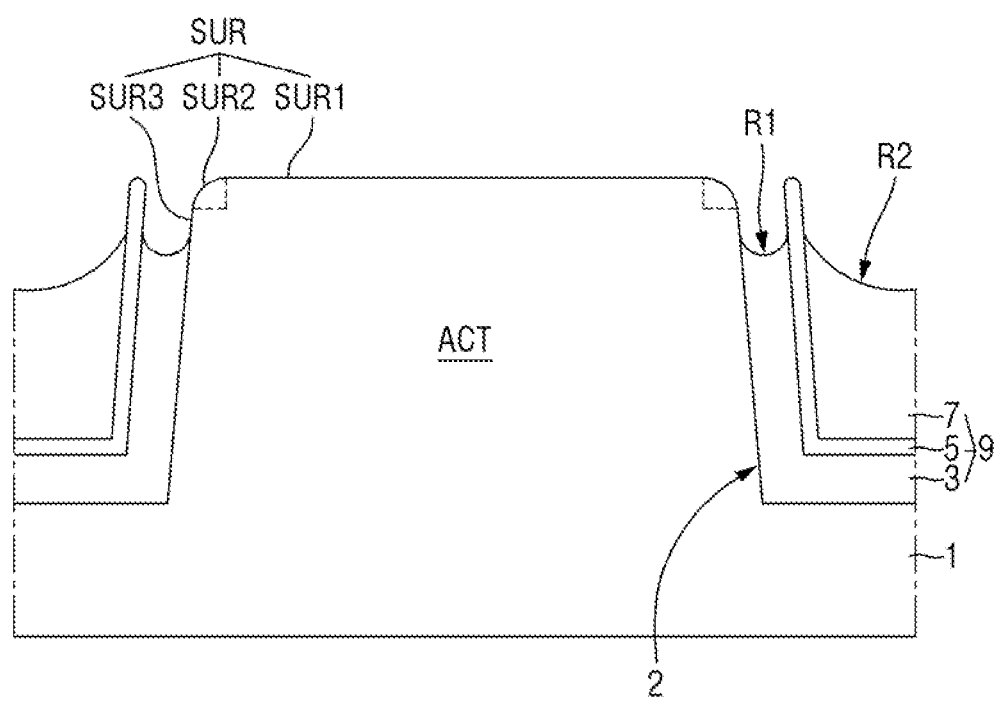
FIG. 1, FIG. 2A, FIG. 2B, and FIG. 3 to FIG. 7 illustrate intermediate steps of a method for manufacturing a semiconductor memory device according to embodiments of the present disclosure.

Terms such as "first direction D1", "second direction D2" and "third direction D3" as used herein should not be interpreted only to have a geometric relationship in which the first direction, the second direction, and the third direction are perpendicular to each other. The "first direction D1", "second direction D2" and "third direction D3" may be interpreted to have a broader direction within a range in which components herein may work functionally.

Hereinafter, embodiments of the present disclosure will be described in detail with reference to the accompanying drawings. The same reference numerals may be used for the same components in the drawings, and duplicate descriptions thereof may be omitted.

In the drawings of a semiconductor memory device according to some embodiments, a DRAM (Dynamic Random Access Memory) is illustrated by way of example. However, embodiments of the disclosure are not necessarily limited thereto.

FIG. 1, FIG. 2A, FIG. 2B, and FIG. 3 to FIG. 7 illustrate intermediate steps of a method for manufacturing a semiconductor memory device according to some embodiments of the present disclosure.

First, referring to FIG. 1, in some embodiments, a substrate is provided. The substrate 1 may be, for example, a silicon single crystal substrate or an SOI (Silicon on Insulator) substrate. Alternatively, the substrate 1 may include at least one of silicon germanium, SGOI (silicon germanium on insulator), indium antimonide, lead telluride compound, indium arsenide, indium phosphide, gallium arsenide, or gallium antimonide. However, embodiments of the disclosure are not necessarily limited thereto.

A trench 2 is formed in the substrate 1. The trench is formed by etching a portion of the substrate. An element isolation film 9 is disposed in the trench 2. The element isolation film 9 fills the trench 2. The element isolation film 9 includes a first liner 3 that conformally covers an inner sidewall and a bottom surface of the trench 2, a buried insulating film 7 that fills the trench 2, and a second liner 5 that is interposed between the first liner 3 and the buried insulating film 7.

Each of the first liner 3, the second liner 5 and the buried insulating film 7 includes an insulating material. For example, the first liner 3 includes silicon oxide. The second liner 5 includes silicon nitride. The buried insulating film 7 includes silicon oxide. However, embodiments of the present disclosure are not necessarily limited thereto.

In some embodiments, the element isolation film 9 defines an active area ACT, The active area ACT is disposed in the substrate 1, and is defined by the element isolation film 9. In the element isolation film 9, a top of the second liner 5 protrudes upwardly beyond a top of each of the first liner 3 and the buried insulating film 7. A first recess R1 is formed in an upper surface of the first liner 3. A second recess R2 is formed in an upper surface of the buried insulating film 7. A vertical depth from an upper surface SUR1 of the substrate 1 to the lowest point of the first recess R1 is less than a vertical depth from the upper surface SUR1 of the substrate 1 to the lowest point of the second recess R2. A depth of the second recess R2 is greater than a depth of the first recess R1. For example, the buried insulating film 7 has a larger recess than the first liner 3.

In some embodiments, a surface SUR of the substrate 1 is exposed. The surface SUR of the substrate 1 includes a first portion SUR1, a second portion SUR2, and a third portion SUR3. The first portion SUR1 of the surface SUR of the substrate 1 is the upper surface of the substrate 1. The second portion SU R2 of the surface SUR of the substrate 1 is a corner portion of the substrate 1. The third portion SUR3 of the surface SUR of the substrate 1 is a side surface of the substrate 1. The corner portion SUR2 of the substrate 1 is curved. For example, the corner portion SUR2 of the substrate 1 has a curved surface that connects the upper surface SUR1 and the side surface SUR3 of the substrate 1 to each other.

The first recess R1 exposes the corner portion SUR2 and a portion of the side surface SUR3 of the substrate 1. In a process of manufacturing a semiconductor memory device according; to some embodiments, a process is performed that removes a residual film present on the substrate 1. As the process is performed, each of the first liner 3, the buried insulating film 7 and the substrate 1 is partially removed. As the first liner 3 is recessed, a portion of the side surface SUR3 of the substrate 1 and the corner portion SUR2 of the substrate 1 is exposed.

Figure 2A:
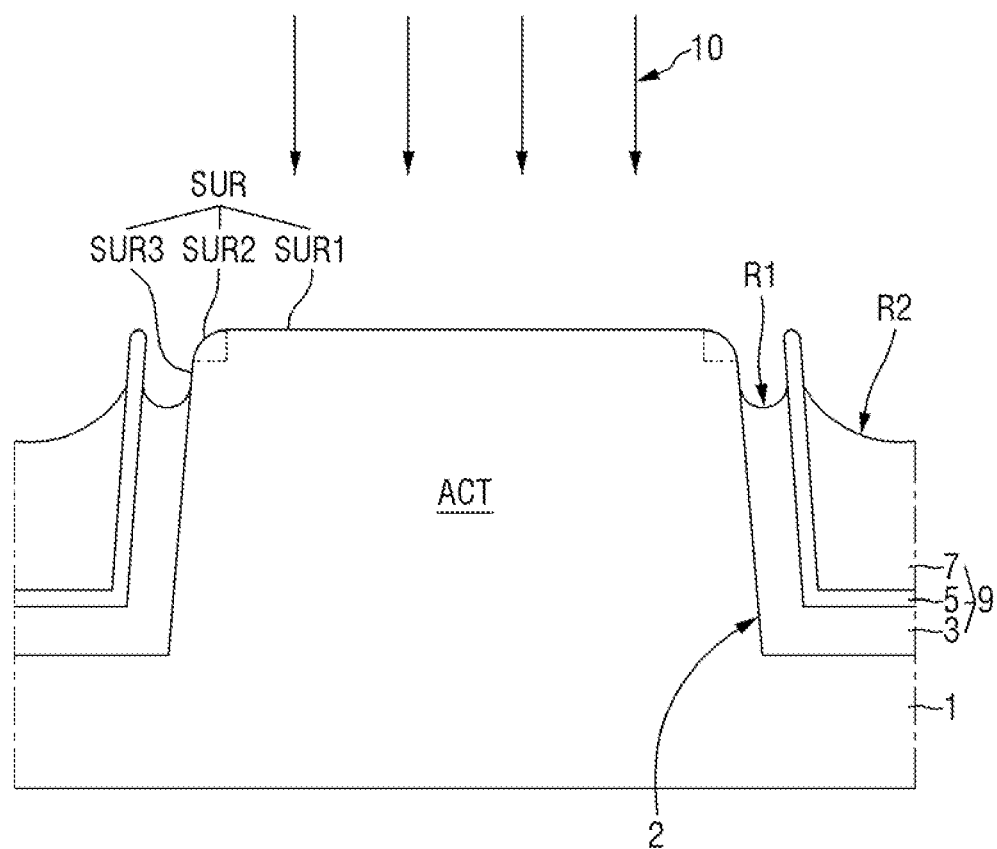

Referring to FIG. 2A, in some embodiments, nitrogen (N) 10 is doped onto the substrate 1. For example, nitrogen 10 is doped onto the upper surface SUR1 of the substrate 1. Although nitrogen is shown to be doped in accordance with an embodiment of the present disclosure, embodiments of the present disclosure are not necessarily limited thereto.

In some embodiments, doping the nitrogen includes doping the nitrogen with energy in a range from 1 keV to 10 keV. Doping the nitrogen includes doping the nitrogen at a dose of $1E+14/cm^3$ or greater and $1E+16/cm^3$ or less. However, embodiments of the present disclosure are not necessarily limited thereto.

Figure 2B:
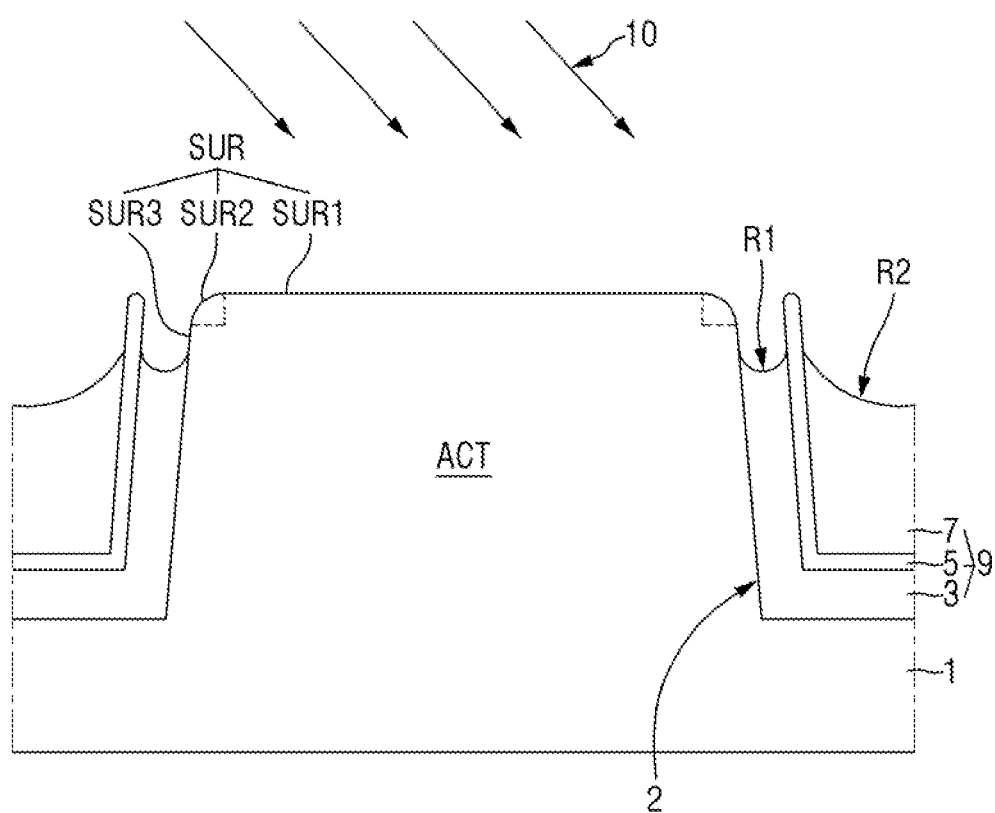

FIG. 2A, doping the nitrogen 10 is illustrated as being performed in a direction perpendicular to the upper surface SUR1 of the substrate 1. However, embodiments of the disclosure are not necessarily limited thereto. For example, as shown in FIG. 2B, in an embodiment, the nitrogen 10 is doped in a direction inclined with respect to the upper surface SUR1 of the substrate 1.

Figure 3:
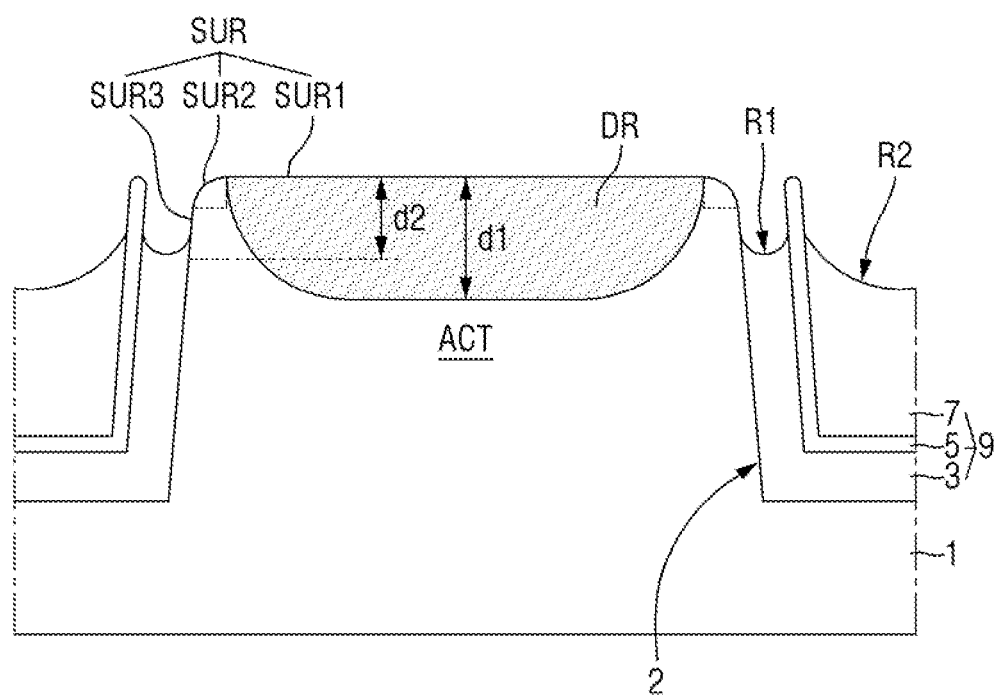

Referring to FIG. 3, in an embodiment, a doped area DR is formed by doping the nitrogen (N) into the substrate 1. The doped area DR is formed under the upper surface SUR1 of the substrate 1. The doped area DR is not formed directly below the corner portion SUR2 and does not extend to the side surface SUR3 of the substrate 1. The doped area DR includes nitrogen (N). For example, in the doped area DR, a portion of a total amount of silicon (Si) binds to nitrogen (N).

In some embodiments, the doped area DR has a first depth d1. The first depth d1 is, for example, in a range of 70 angstroms to 700 angstroms. For example, when nitrogen is doped with 1 key of energy, the first depth d1 of the doped area DR is 70 angstroms or less. When nitrogen is doped with 10 keV of energy, the first depth d1 of the doped area DR is 700 angstroms or less. However, embodiments of the present disclosure are not necessarily limited thereto.

In some embodiments, a concentration of nitrogen in the doped area DR increases and then decreases as the area extends away from the upper surface SUR1 of the substrate 1. A point with the highest nitrogen concentration in the doped area. DR is spaced apart by a second depth d2 from the upper surface SUR1 of the substrate 1. The second depth d2 is, for example, in a range of 50 angstroms to 500 angstroms.

For example, when nitrogen is doped with 2 keV energy, the second depth d2 is 50 angstroms or less. When nitrogen is doped with 10 keV energy, the second depth d2 is 500 angstroms or less. However, embodiments of the present disclosure are not necessarily limited thereto.

Figure 4:
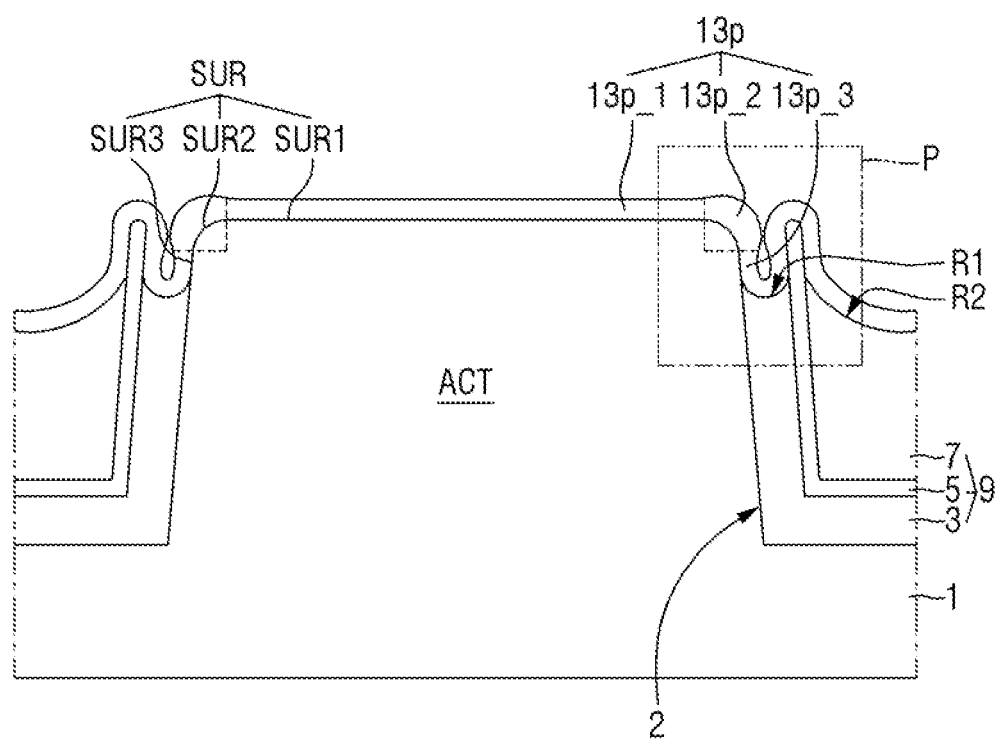
Figure 5:
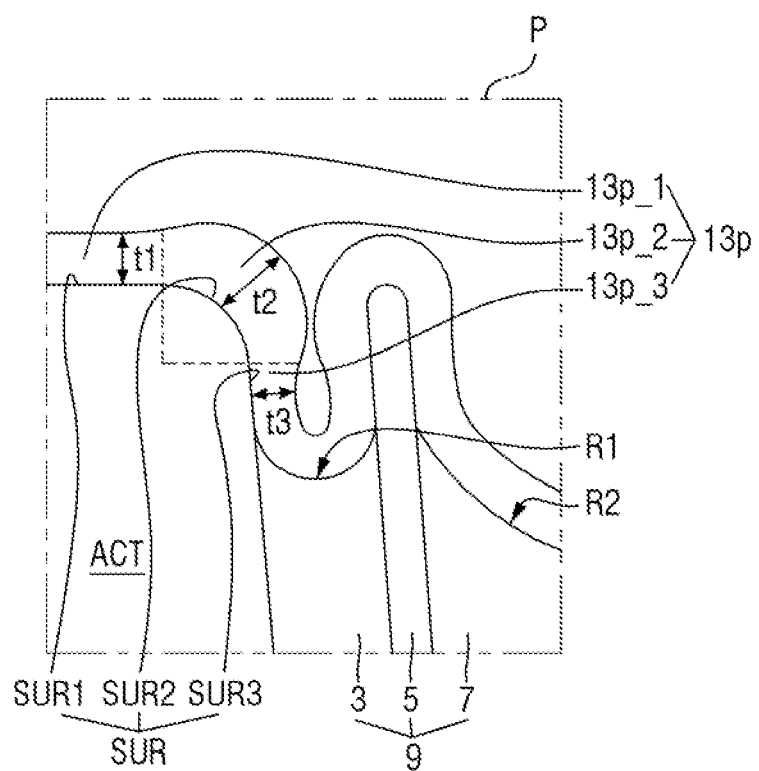

Referring to FIG. 4 and FIG. 5, in an embodiment, a pre-gate insulating film 13p is formed on the surface SUR of the substrate 1. For reference, FIG. 5 is an enlarged view of an area P of FIG. 4.

The pre-gate insulating film 13p is formed along and on the upper surface SUR1 of the substrate 1, the corner portion SUR2 of the substrate 1, the side surface SUR3 of the substrate 1, the upper surface of the first liner 3, a profile of the second liner 5, and an upper surface of the buried insulating film 7.

The pre-gate insulating film 13p is formed via a thermal oxidation process or a deposition process. In addition, the surface SUR of the substrate 1 is cleaned before the pre-gate insulating film 13p is formed. In a process of cleaning the surface SUR of the substrate 1, the surfaces of the element isolation film 9 or the surfaces SUR of the substrate 1 are partially etched.

In a process of forming the pre-gate insulating film 13p, nitrogen (N) buried in the substrate 1 diffuses. Accordingly, in a process of forming the pre-gate insulating film 13p, the doped area DR is removed. The pre-gate insulating film 13p includes at least one of silicon oxide, silicon oxynitride, or a combination thereof.

The pre-gate insulating film 13p includes a first portion 13p_1, a second portion 13p_2, and a third portion 13p_3. The first portion 13p_1 of the pre-gate insulating film 13p extends along and on the upper surface SUR1 of the substrate 1. The second portion 13p_2 of the pre-gate insulating film 13p extends along and on the corner portion SUR2 of the substrate 1. The third portion 13p_3 of the pre-gate insulating film 13p is a remaining portion that excludes the first portion 13p_1 and the second portion 13p_2.

In an embodiment, the first portion 13p_1 of the pre-gate insulating film 13p has a first thickness t1. The second portion of the pre-gate insulating film 13p has a second thickness t2. A portion of the third portion 13p_3 of the pre-gate insulating film 13p formed on the side surface SUR3 of the substrate 1 has a third thickness t3.

The first thickness t1 is less than the second thickness t2. For example, a ratio of the first thickness t1 and the second thickness t2 is greater than 1.00 and less than 1.20. In an embodiment, the ratio of the first thickness t1 and the second thickness t2 is 1.01. However, embodiments of the disclosure are not necessarily limited thereto.

Nitrogen (N) is doped into a portion below the upper surface SUR1 of the substrate 1. Silicon (Si) binds to nitrogen (N) in the portion below the upper surface SUR1 of the substrate 1. On the other hand, nitrogen (N) is not doped into a portion below the corner portion SUR2 of the substrate 1. Silicon (Si) does not bind to nitrogen (N) in the portion below the corner portion SUR2 of the substrate 1.

When forming the pre-gate insulating film 13p on the upper surface SUR1 of the substrate 1, a formation rate of the pre-gate insulating film 13p is low as silicon (Si) and nitrogen (N) bind to each other. For example, the formation rate of the pre-gate insulating film 13p in an area doped with nitrogen (N) is less than that of the pre-gate insulating film 13p in an area not doped with nitrogen (N). For example, the formation rate of the first portion 13p_1 of the pre-gate insulating film 13p is less than the formation rate of the second portion 13p_2 of the pre-gate insulating film 13p. Accordingly, the first thickness t1 is less than the second thickness t2.

In some embodiments, the third thickness t3 is equal to the second thickness t2. The doped area DR is not formed next to the side surface SUR3 of the substrate 1. For example, silicon (Si) does not bind to nitrogen (N) in the portion adjacent to the side surface SUR3 of the substrate 1. For example, the formation rate of the second portion 13p_2 of the pre-gate insulating film 13p is the same as the formation rate of the third portion 13p_3 of the pre-gate insulating film 13p, The third thickness 13 is equal to the second thickness t2.

In an embodiment, the third thickness t3 is less than the second thickness t2. As a width of the first recess R1 is small, an air gap or a seam may form in the third portion 13p_3 of the pre-gate insulating film 13p when forming the third portion 13p_3 of the pre-gate insulating film 13p. The third thickness t3 is less than the second thickness t2.

Figure 6:
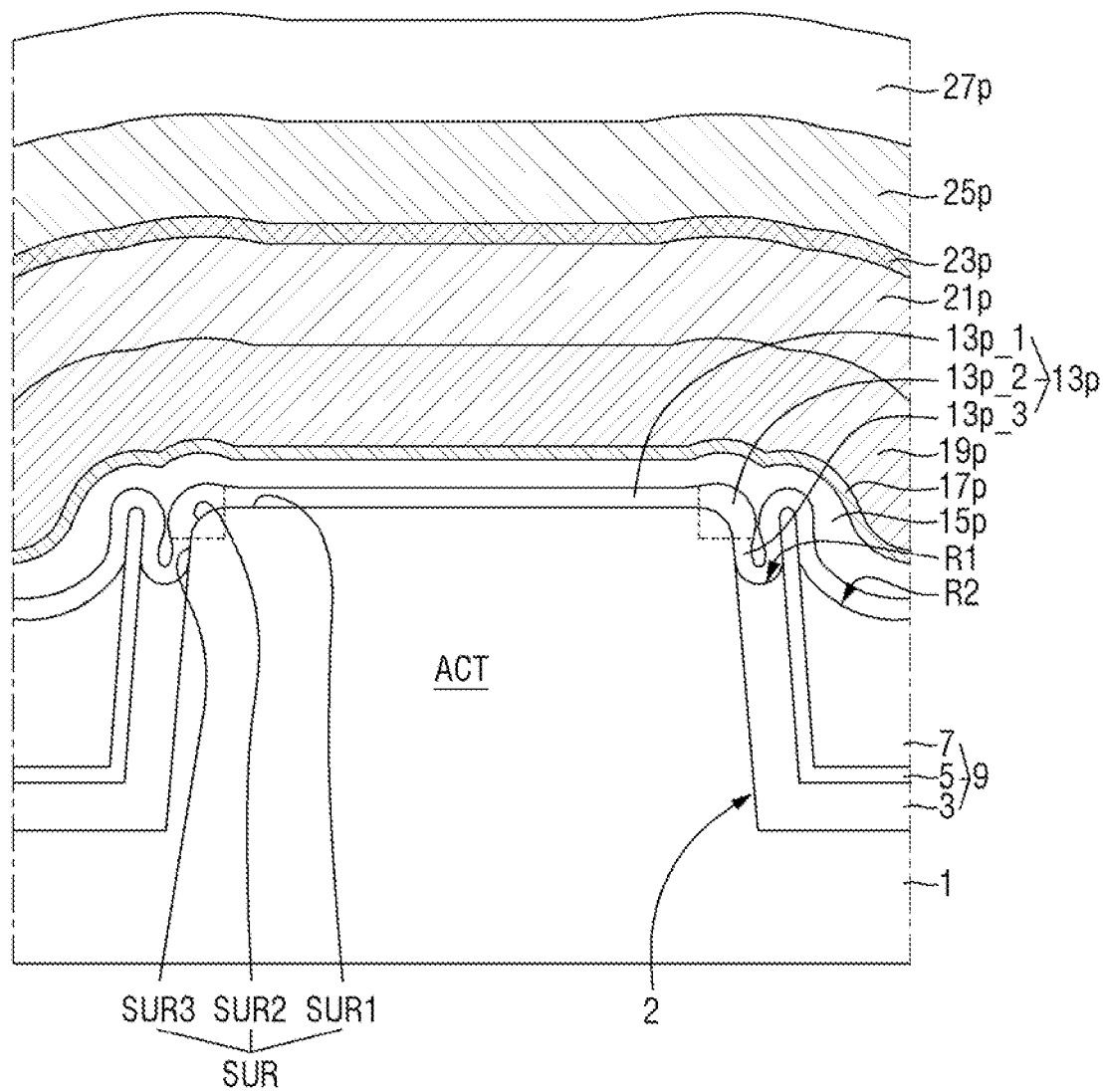

Referring to FIG. 6, in an embodiment, a pre-high dielectric constant film 15p, a pre-diffusion suppressing film 17p, a pre-work function film 19p, a pre-lower electrode 21p, a pre-middle electrode 23p, a pre-upper electrode 25p, and a pre-capping pattern 27p are stacked sequentially in this order on the pre-gate insulating film 13p.

The pre-high dielectric constant film 15p is formed via a deposition process such as CVD (Chemical Vapor Deposition) or ALD (Atomic Layer Deposition). The pre-high dielectric constant film 15p includes a material that has a higher dielectric constant than silicon oxide. For example, the pre-high dielectric constant film 15p includes at least one of hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, or combinations thereof.

The pre-diffusion suppressing film 17p includes, for example, at least one of titanium nitride, tungsten nitride, or tantalum nitride. The pre-diffusion suppressing film 17p prevents diffusion of lanthanum (La) in the pre-work function film 19p. The pre-diffusion suppressing film 17p is in contact with the pre-high dielectric constant film 15p.

The pre-work function film 19p includes, for example, at least one of lanthanum (La), lanthanum oxide (LaO), magnesium (Mg), magnesium oxide (MgO), tantalum (Ta), tantalum nitride (TaN), or niobium (Nb).

The pre-lower electrode 21p includes, for example, polysilicon doped with impurities. The pre-lower electrode 21p may be doped with N-type impurities or P-type impurities. The pre-middle electrode 23p includes, for example, TiSiN. The pre-upper electrode 25p includes, for example, tungsten (W). However, embodiments op of the present disclosure are not necessarily limited thereto.

The pre-capping pattern 27p includes, for example, silicon nitride. However, embodiments of the disclosure are not necessarily limited thereto.

Figure 7:
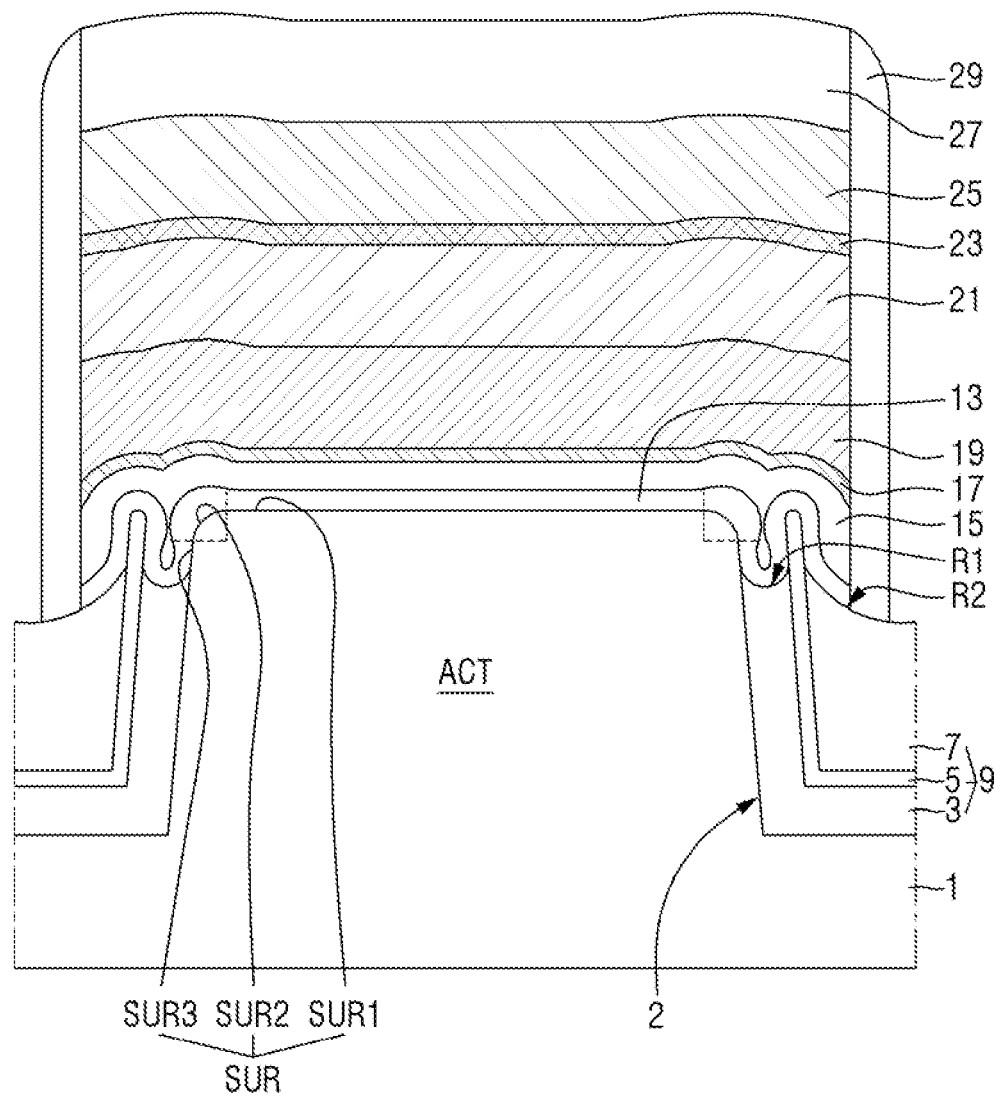

Referring to FIG. 7, in an embodiment, the pre-gate insulating film 13p, the pre-high dielectric constant film 15p, the pre-diffusion suppressing film 17p, the pre-work function film 19p, the pre-lower electrode 21p, the pre-middle electrode 23p, the pre-upper electrode 25p, and the pre-capping pattern 27p are patterned such that a gate insulating film 13, a high dielectric constant film 15, a diffusion suppressing film 17, a work function film 19, a lower electrode 21, a middle electrode 23, an upper electrode 25 and a capping pattern 27 are formed.

The gate insulating film 13, the high dielectric constant film 15, the diffusion suppressing film 17, the work function film 19, the lower electrode 21, the middle electrode 23, the upper electrode 25 and the capping pattern 27 are respectively made of the same materials as the pre-gate insulating film 13p, the pre-high dielectric constant film 15p, the pre-diffusion suppressing film 17p, the pre-work function film 19p, the pre-lower electrode 21p, the pre-middle electrode 23p, the pre-upper electrode 25p, and the pre-capping pattern 27p.

A gate spacer 29 is formed on sidewalls of the gate insulating film 13, the high dielectric constant film 15, the diffusion suppressing film 17, the work function film 19, the lower electrode 21, the middle electrode 23, the upper electrode 25 and the capping pattern 27. The gate spacer 29 is formed on the buried insulating film 7. Alternatively, the gate spacer 29 is formed on the upper surface SUR1 of the substrate 1. The gate spacer 29 includes an insulating material. The gate spacer 29 includes, for example, silicon oxide or silicon nitride. However, embodiments of the disclosure are not necessarily limited thereto.

FIG. 8 to FIG. 15 illustrate intermediate steps of a method of manufacturing a semiconductor memory device according to an embodiment of the present disclosure. For convenience of illustration, the following descriptions are based on differences from embodiments described with reference FIG. 1 to FIG. 7.

Figure 8:
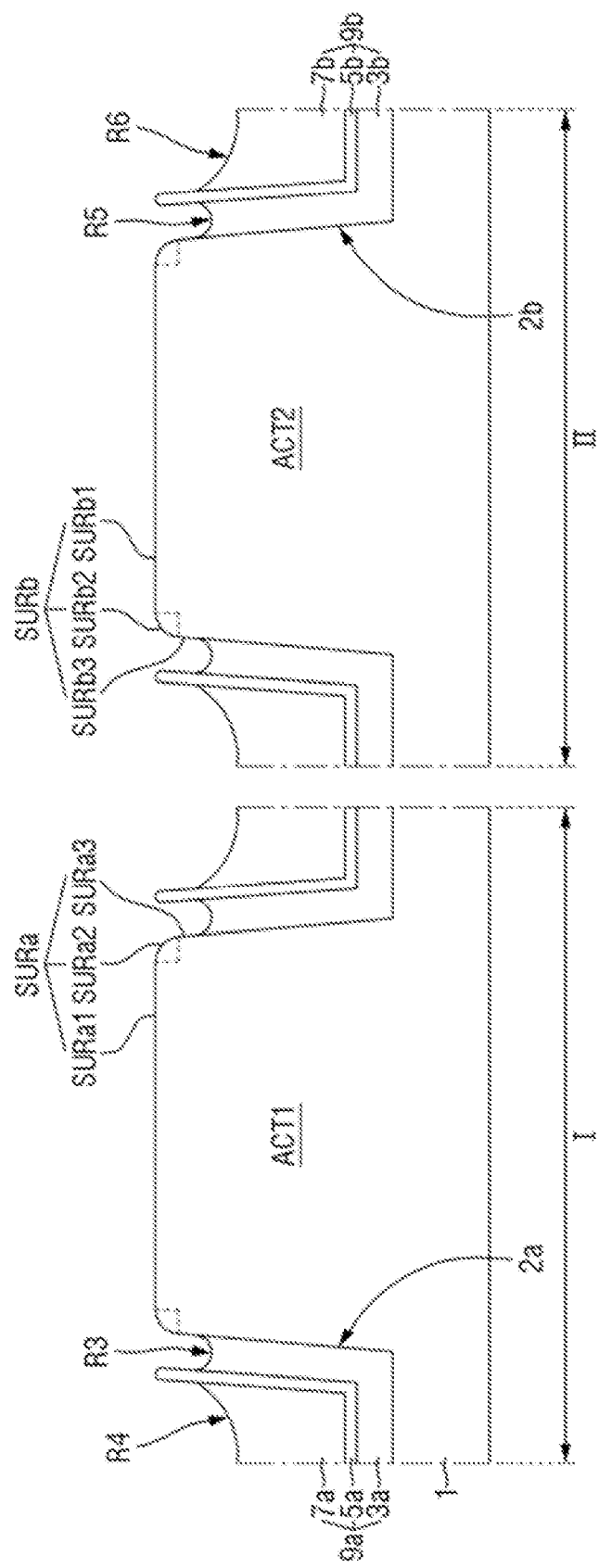
FIG. 8 to FIG. 15 illustrate intermediate steps of a method for manufacturing a semiconductor memory device according to embodiments of the present disclosure.

Referring to FIG. 8, in an embodiment, the substrate 1, which includes a first region I and a second region II, is provided. A high-voltage transistor is disposed in the first region I. A low-voltage transistor is disposed in the second region II. However, embodiments of the present disclosure are not necessarily limited thereto.

A first trench 2a is formed in the substrate 1 and in the first region I thereof. A first element isolation film 9a is disposed in the first trench 2a. The first element isolation film 9a defines a first active area ACT1. The first element isolation film 9a fills the first trench 2a. The first element isolation film 9a includes as third liner 3a that conformally covers an inner sidewall and a bottom surface of the first trench 2a, a first buried insulating film 7a that fills the first trench 2a, and a fourth liner 5a disposed between the third liner 3a and the first buried insulating film 7a.

A second trench 2b is formed in the substrate 1 and in the second region II thereof. A second element isolation film 9b is disposed in the second trench 2b. The second element isolation film 9b defines a second active area ACT2. The second element isolation film 9b fills the second trench 2b. The second element isolation film 9b includes a fifth liner 3b that conformally covers an inner sidewall and a bottom surface of the second trench 2b, a second buried insulating film 7b that fills the second trench 2b, and a sixth liner 5b interposed between the fifth liner 3b and the second buried insulating film 7b.

Each of the third liner 3a, the fourth liner 5a, the first buried insulating film 7a, the fifth liner Sb, the sixth liner 5b, and the second buried insulating film 7b includes an insulating material. For example, each of the third liner 3a and the fifth liner 3b includes silicon oxide. Each of the fourth liner 5a and the sixth liner 5b includes silicon nitride. Each of the first buried insulating film 7a and the second buried insulating 7b includes silicon oxide. However, embodiments of the present disclosure are not necessarily limited thereto.

In the first element isolation film 9a, an upper surface of the fourth liner 5a protrudes upward above an upper surface of each of the third liner 3a and the first buried insulating 7a. A third recess R3 is formed in the upper surface of the third liner 3a. A fourth recess R4 is formed in an upper surface of the first buried insulating film 7a. A vertical depth from a first upper surface SURa2 of the substrate 1 in the first region I to the lowest point of the third recess R3 is less than a vertical depth from the first upper surface SURa1 of the substrate 1 in the first region I to the lowest point of the fourth recess R4. A depth of the fourth recess R4 is greater than a depth of the third recess R3. For example, the first buried insulating film 7a is recessed to a larger amount than the third liner 3a.

In the second element isolation film 9b, an upper surface of the sixth liner 5b protrudes upward above an upper surface of each of the fifth liner Sb and the second buried insulating film 7b. A fifth recess R5 is formed in the upper surface of the fifth liner 3b. A sixth recess R6 is formed in the upper surface of the second buried insulating film 7b. A vertical depth from a second upper surface SURb1 of die substrate 1 in die second region II to the lowest point of the fifth recess R5 is less than a vertical depth from the second upper surface SURb1 of the substrate 1 in the second region II to the lowest point of the sixth recess R6. A depth of the sixth recess R6 is greater than a depth of the fifth recess R5. For example, the second buried insulating film 7b is recessed to a larger amount than the fifth liner 3b.

In some embodiments, a first surface SURa of the substrate 1 in the first region I is exposed. The first surface SURa of the substrate 1 in the first region I includes a first portion SURa1, a second portion SURa2, and a third portion SURa3. In accordance with embodiments of the present disclosure, the first portion SURa1 of the first surface SURa of the substrate 1 in the first region I is the first upper surface of the substrate 1 in the first region L The second portion SURa2 of the first surface SURa of the substrate 1 in the first region I is a first corner portion of the substrate 1 in the first region I. The third portion SURa3 of the first surface SURa of the substrate 1 in the first region I is a first side surface of the substrate 1 in the first region I.

In some embodiments, a second surface SURb of the substrate 1 in the second region II is exposed. The second surface SURb of the substrate 1 in the second region II includes a first portion SURb a second portion SURb2, and a third portion SURb3. In accordance with embodiments of the present disclosure, the first portion SURb1 of the second surface SURb of the substrate 1 in the second region II is a second upper surface of the substrate 1 in the second region II. The second portion SURb2 of the second surface SURb of the substrate 1 in the second region II is a second corner portion of the substrate 1 in the second region II. The third portion SURb3 of the second surface SURb of the substrate 1 in the second region II is a second side surface of the substrate 1 in the second region II.

Figure 9:
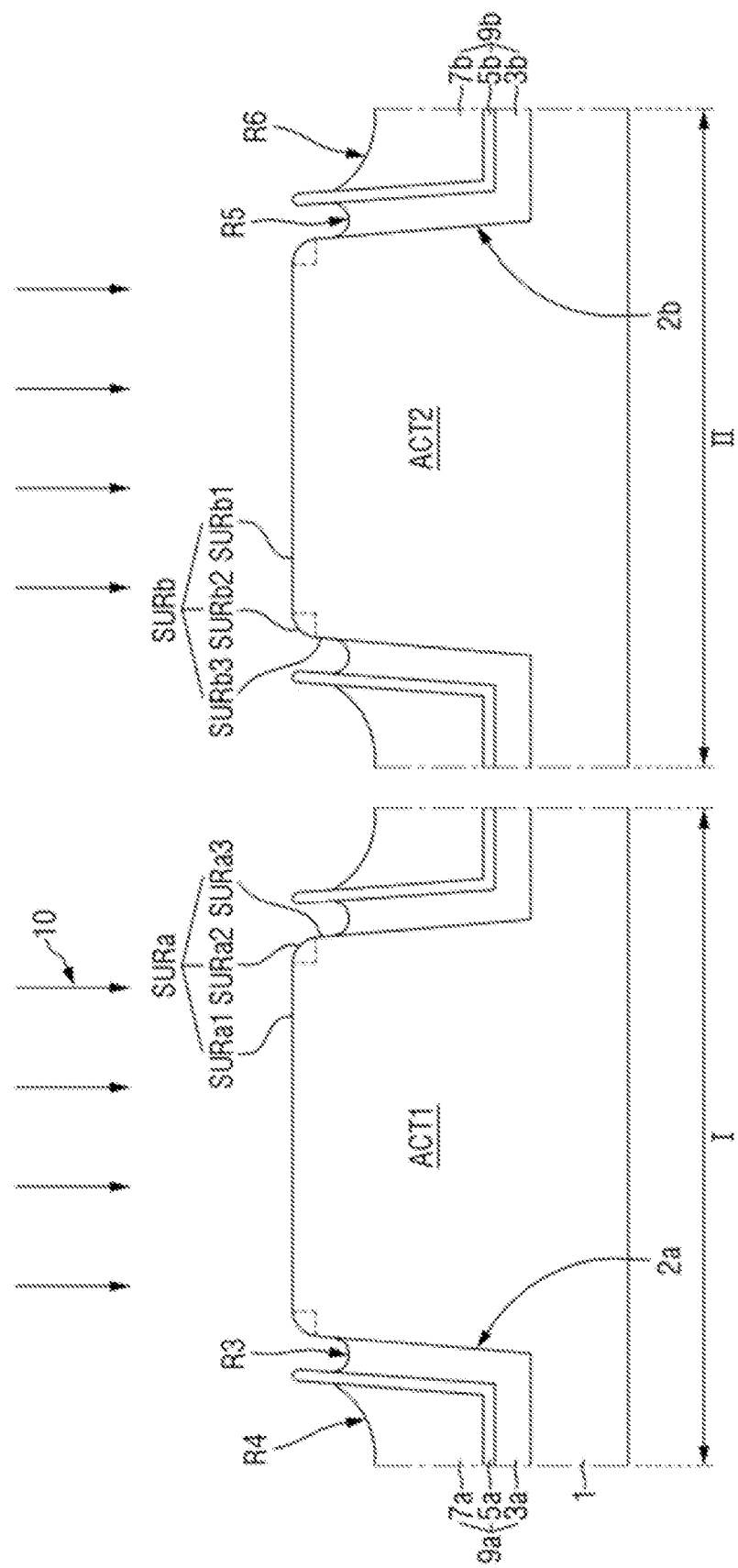

Referring to FIG. 9, in an embodiment, nitrogen (N) 10 is doped onto an entire surface of the substrate 1. For example, nitrogen is doped onto the first upper surface SURa1 of the substrate 1 in the first region I, and nitrogen is doped onto the second upper surface SURb1 of the substrate 1 in the second region II.

In some embodiments, the nitrogen is doped with an energy of 1 keV or greater and 10 keV or less. Nitrogen is doped at a dose of $1E+14/cm^3$ or greater and $1E+16/cm^3$ or less. However, embodiments of the disclosure are not necessarily limited thereto.

Figure 10:
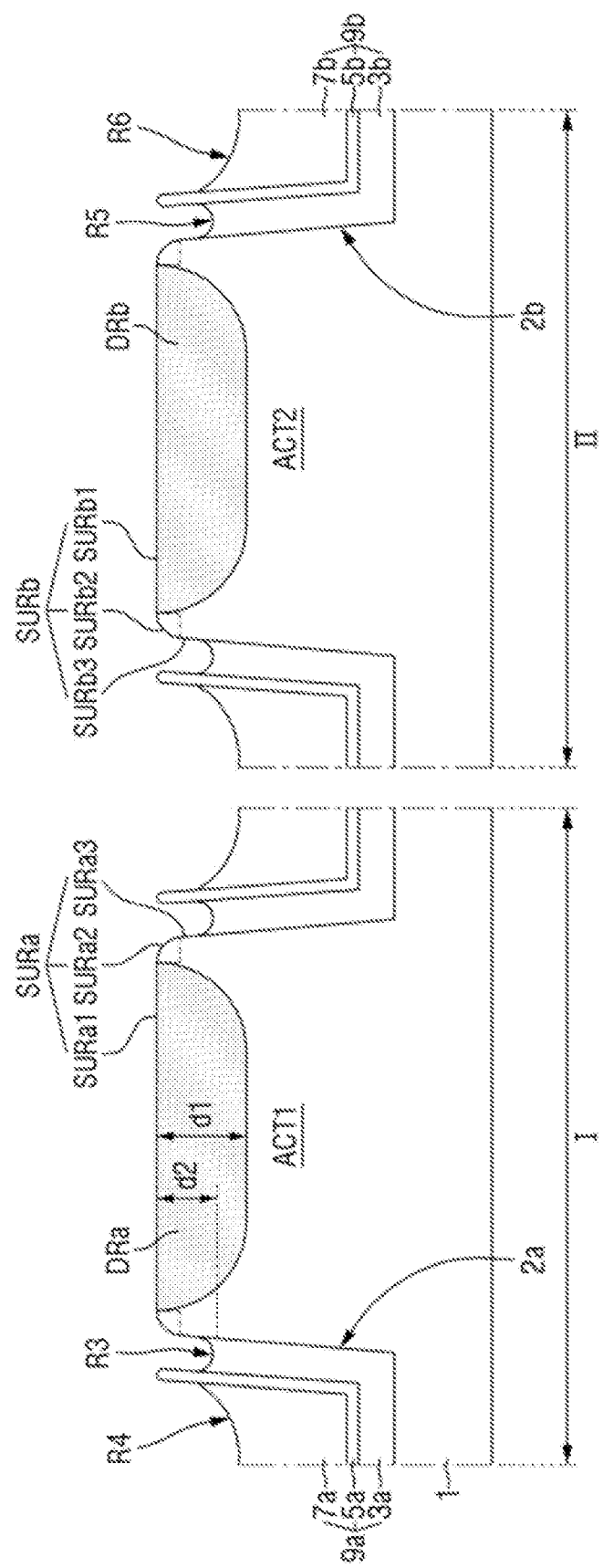

Referring to FIG. 10, in an embodiment, a first doped area DRa is formed by doping nitrogen (N) onto the substrate 1 in the first region I. A second doped area DRb is formed by doping nitrogen (N) onto the substrate 1 in the second region II. A configuration of the second doped area DRb is substantially the same to that of the first doped area DRa.

In some embodiments, the first doped area DRa has a first depth d1. The first depth d1 is, for example, in a range from 70 angstroms to 700 angstroms. For example, when nitrogen is doped with 1 keV energy, the first depth d1 of the first doped area DRa is 70 angstroms or less. When nitrogen is doped with 10 keV energy, the first depth d1 of the first doped area DRa is 700 angstroms or less. However, embodiments of the present disclosure are not necessarily limited thereto.

In some embodiments, a concentration of nitrogen in the first doped area DRa increases and then decreases with increasing distance from the first upper surface SURa1 of the substrate 1 in the first region I. A point having the highest nitrogen concentration in the first doped area DRa is at a second depth d2 from the first upper surface SURa1 of the substrate 1 in the first region I. The second depth d2 is, for example, in a range from 50 angstroms to 500 angstroms.

For example, when nitrogen is doped with 1 keV energy, the second depth d2 of the first doped area DRa is 50 angstroms or less. When nitrogen is doped with 10 keV energy, the second depth d2 of the first doped area DRa is 500 angstroms or less. However, embodiments of the present disclosure are not necessarily limited thereto.

Figure 11:
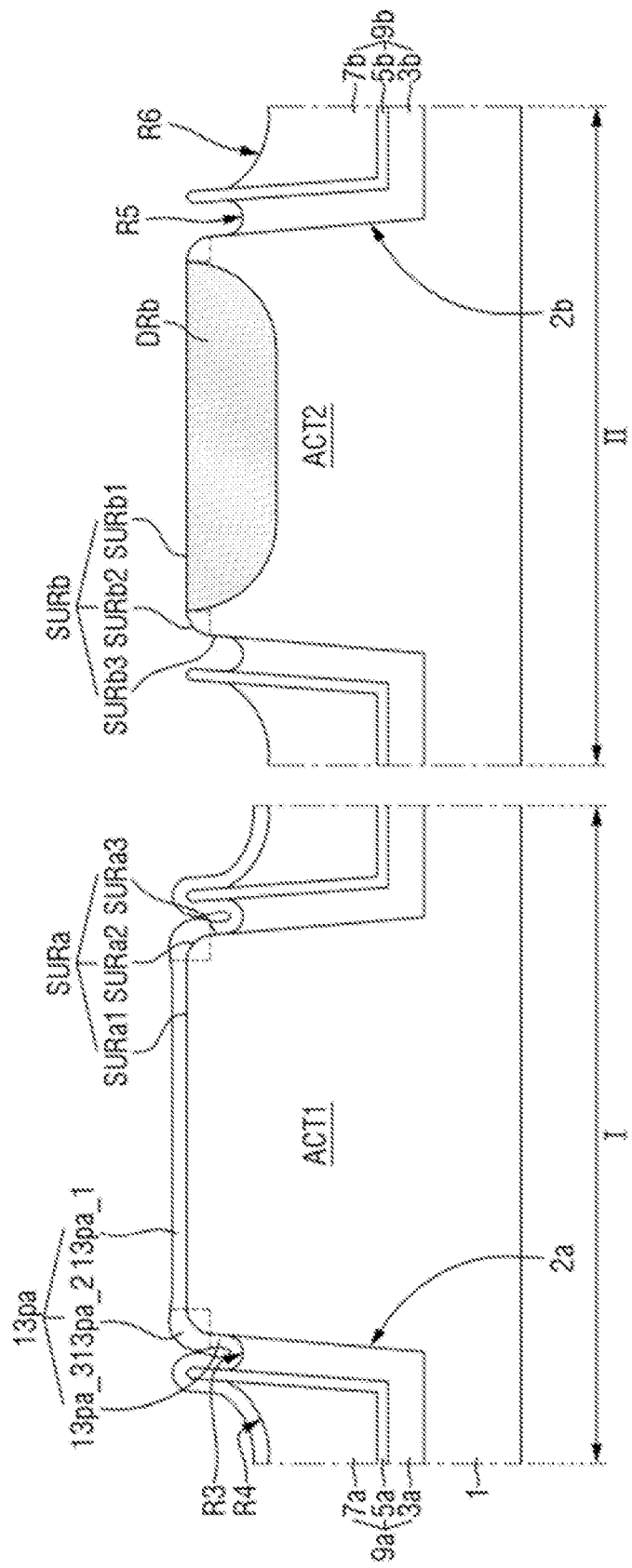

Referring to FIG. 11, in an embodiment, a first, pre-gate insulating film 13pa is formed on the first surface SURa of the substrate 1 in the first region I.

The first pre-gate insulating film 13pa is formed along and on the first upper surface SURa1 of the substrate 1, the first corner portion SURa2 of the substrate 1, the first side surface SURa3 of the substrate 1, the upper surface of the third liner 3a, and a profile of the fourth liner 5a and the upper surface of the first buried insulating film 7a.

The first pre-gate insulating film 13pa is formed by a thermal oxidation process or a deposition process. In addition, the first surface SURa of the substrate 1 in the first region I is cleaned before the first pre-gate insulating film 13pa is formed. In the process of cleaning the first surface SURa of the substrate 1, the surfaces of the first element isolation film 9a or the first surface SURa of the substrate 1 are also partially etched.

In the process of forming the first pre-gate insulating film 13pa, nitrogen (N) buried in the substrate 1 in the first region I can diffuse. Accordingly, when forming the first pre-gate insulating film 13pa, the first doped area DRa is removed. In this regard, the nitrogen (N) buried in the substrate in the second region II does not diffuse. When forming the first pre-gate insulating film 13pa, the second doped area DRb is not removed. The first pre-gate insulating film 13pa includes at least one of silicon oxide, silicon oxynitride, or a combination thereof.

The first pre-gate insulating film 13pa includes a first portion 13pa_1, a second portion 13pa_2 and a third portion 13pa_3. The first portion 13pa_1 of the first pre-gate insulating film 13pa extends along and on the first upper surface SURa1 of the substrate 1. The second portion 13pa_2 of the first pre-gate insulating film 13pa extends along and on the first corner portion SURa2 of the substrate 1. The third portion 13pa_3 of the first pre-gate insulating film 13pa is a remaining portion thereof that excludes the first portion 13pa_1 and the second portion 13pa_2.

Figure 12:
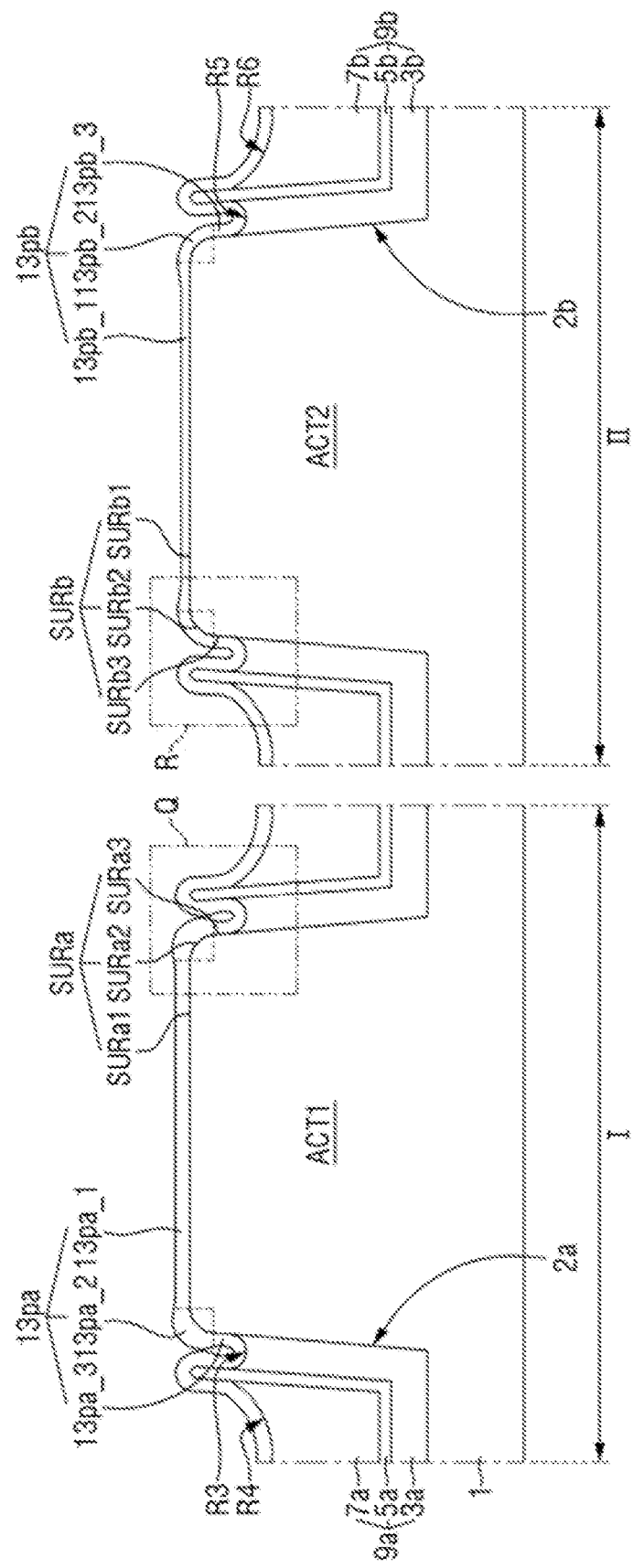

Referring to FIG. 12, in an embodiment, a second pre-gate insulating film 13pb is formed on the second surface SURb of the substrate 1 in the second region II.

The second pre-gate insulating film 13pb is formed along and on the second upper surface SURb1 of the substrate 1, the second corner portion SURb2 of the substrate 1, the second side surface SURb3 of the substrate 1, the upper surface of the fifth liner 3b, a profile of the sixth liner 5b, and the upper surface of the second buried insulating film 7b.

The second pre-gate insulating film 13pb is formed by a thermal oxidation process or a deposition process. In addition, the second surface SURb of the substrate 1 in the second region II is cleaned before the second pre-gate insulating film 13pb is formed when cleaning the second surface SURb of the substrate 1, the surfaces of the second element isolation film 9b or the second surface SURb of the substrate 1 are partially etched.

When forming the second pre-gate insulating film 13pb, nitrogen (N) buried in the substrate 1 in the second region II can diffuse. Accordingly, when forming the second pre-gate insulating film 13pb, the second doped area DRb is removed. The second pre-gate insulating film 13pb includes the same material as the first pre-gate insulating film 13pa.

The second pre-gate insulating film 13pb includes a first portion 13pb_1, a second portion 13pb_2 and a third portion 13pb_3. The first portion 13pb_1 of the second pre-gate insulating film 13pb extends along and on the second upper surface SURb1 of the substrate 1. The second portion 13pb_2 of the second pre-gate insulating film 13pb extends along and on the second corner portion SURb2 of the substrate 1. The third portion 13pb_3 of the second pre-gate insulating film 13pb is a remaining portion that excludes the first portion 13pb_1 and the second portion 13pb_2.

Figure 13:
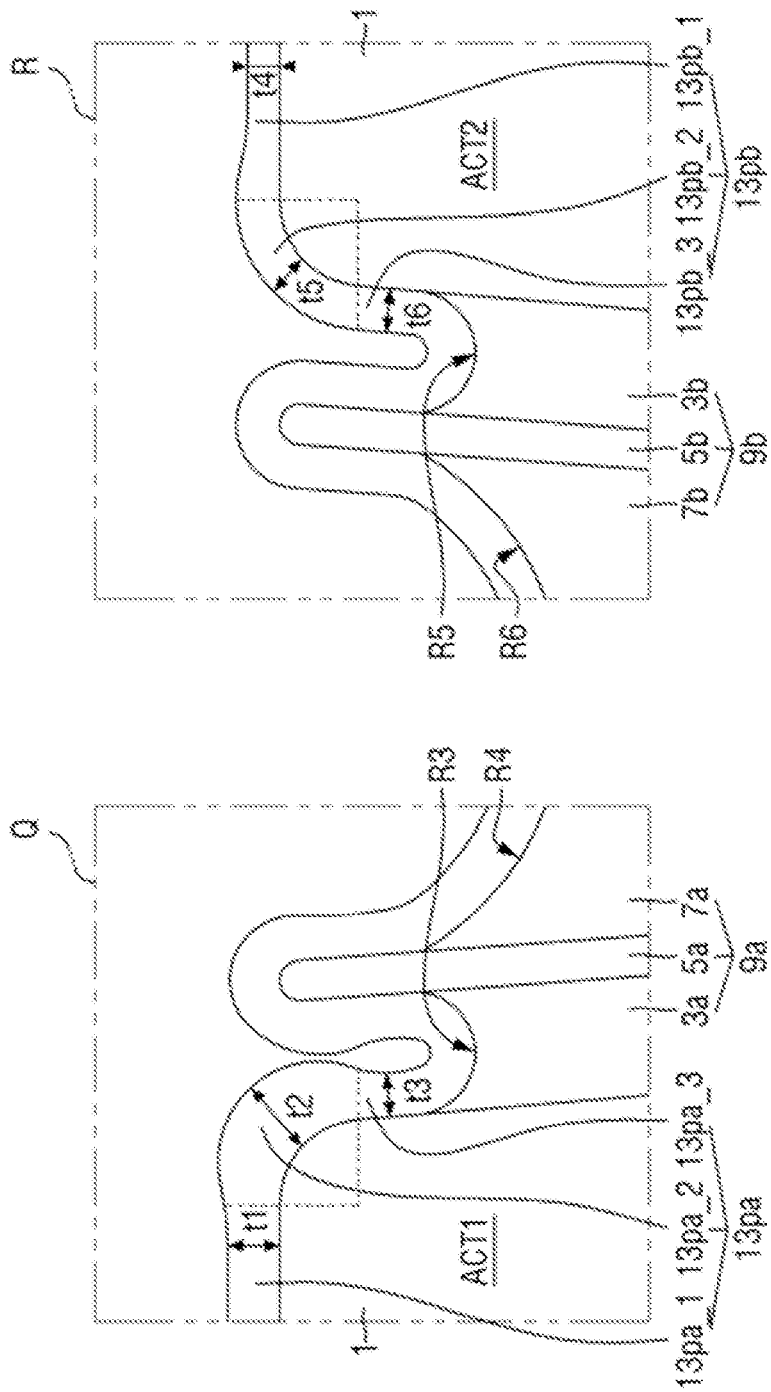

Referring to FIG. 13, in an embodiment, a thickness of the first pre-gate insulating film 13pa is greater than a thickness of the second pre-gate insulating film 13pb. For reference, FIG. 13 is an enlarged view of an area Q and an area R of FIG. 12.

As described above, a high-voltage transistor is formed on the substrate and in the first region I. A low-voltage transistor is formed on the substrate and in the second region II. The first pre gate insulating film 13pa acts as a high-voltage gate insulating film, while the second pre-gate insulating film 13pb acts as a low-voltage gate insulating film. Accordingly, the second pre-gate insulating film 13pb is thinner than the first pre-gate insulating film 13pa.

For example, the first portion 13pa_1 of the first pre-gate insulating film 13pa has a first thickness t1. The second portion 13pa_2 of the first pre-gate insulating film 13pa has a second thickness t2. A portion of the third portion 13pa_3 of the first pre-gate insulating film 13pa formed on the first side surface SURa3 of the substrate 1 has a third thickness t3. The first portion 13pb_1 of the second pre-gate insulating film 13pb has a fourth thickness t4. The second portion 13pb_2 of the second pre-gate insulating film 13pb has a fifth thickness t5, A portion of the third portion 13pb_3 of the second pre-gate insulating film 13pb formed on the second side surface SURb3 of the substrate 1 has a sixth thickness t6.

In some embodiments, the first thickness t1 is greater than the fourth thickness t4. The second thickness t2 is greater than the fifth thickness t5. The third thickness t3 is greater than the sixth thickness t6.

The description of the first thickness t1 to the third thickness t3 is the same as that provided with reference to FIG. 5, and thus is omitted.

The fourth thickness t4 is less than the fifth thickness t5. For example, a ratio of the fourth thickness t4 and the fifth thickness t5 is greater than 1.00 and less than 1.20. In an embodiment, the ratio of the fourth thickness t4 and the fifth thickness t5 is 1.01. However, embodiments of the disclosure are not necessarily limited thereto.

Nitrogen (N) is doped in a portion under the second upper surface SURb1 of the substrate 1. Silicon (Si) binds to nitrogen (N) in the portion under the second upper surface SURb1 of the substrate 1. However, nitrogen (N) is not doped into a portion below the second corner portion SURb2 of the substrate 1. Silicon (Si) does not bind to nitrogen (N) in the portion below the second corner portion SURb2 of the substrate 1.

When forming the second pre-gate insulating film 13pb on the second upper surface SURb1 of the substrate 1, a rate at which the second pre-gate insulating film 13pb is formed is low as silicon (Si) and nitrogen (N) bind to each other. For example, in the area doped with nitrogen (N), the formation rate of the second pry gate insulating film 13pb is lower than that of the second pre-gate insulating film 13pb in the area not doped with nitrogen (N). For example, the formation rate of the first portion 13pb_1 of the second pre-gate insulating film 13pb is lower than the formation rate of the second portion 13pb_2 of the second pre-gate insulating film 13pb. Accordingly, the fourth thickness t4 is less than the fifth thickness t5.

In some embodiments, the sixth thickness t6 is equal to the fifth thickness t5. Nitrogen (N) is not doped into the second side surface SURb3 of the substrate 1 in the second region II. Accordingly, a rate at which the second pre-gate insulating film 13pb is formed on the second corner portion SURb2 is the same as a rate at which the second pre-gate insulating film 13pb is formed on the third side surface SURb3. Accordingly, the sixth thickness to is equal to the fifth thickness t5.

Figure 14:
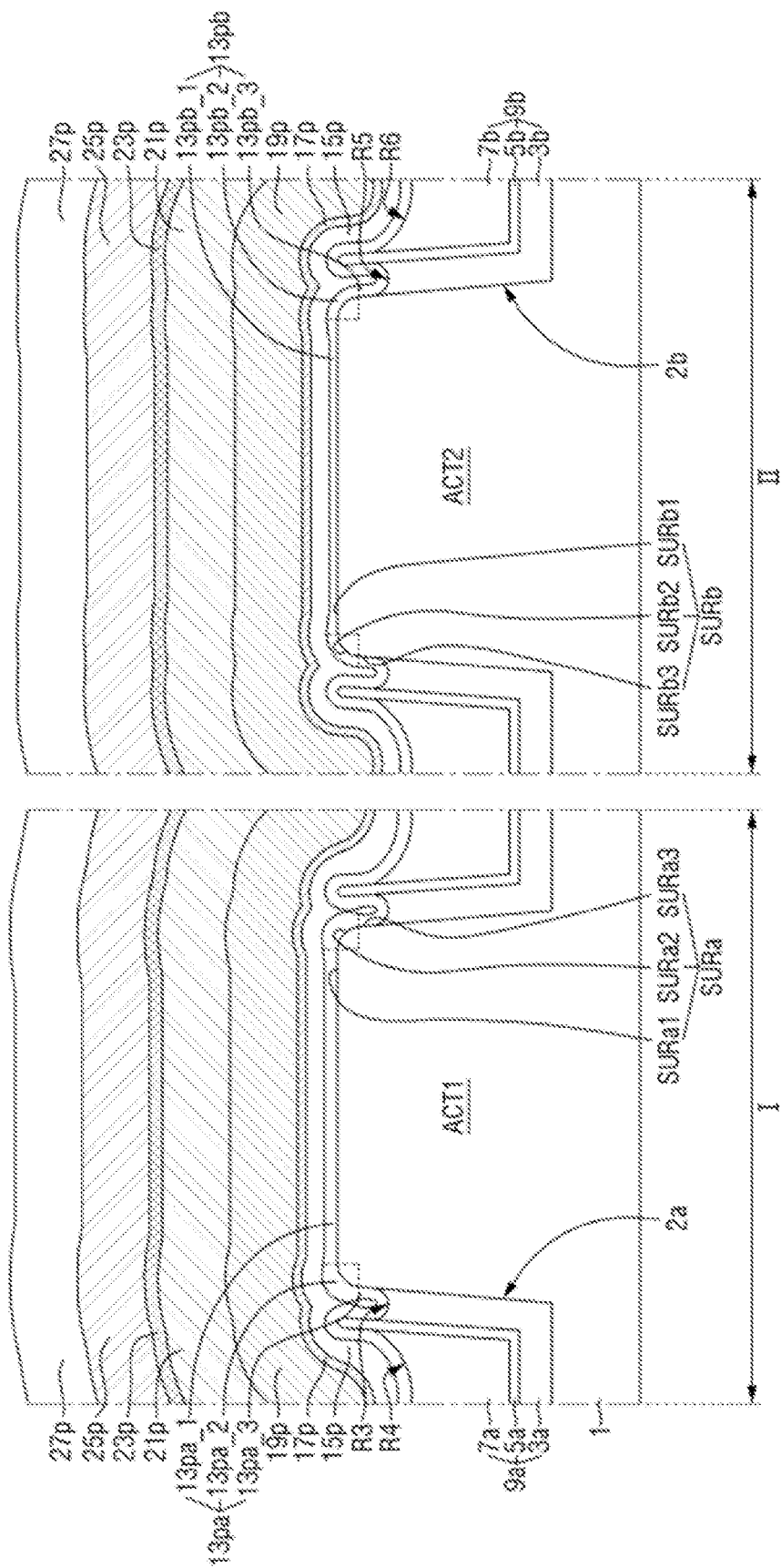

Referring to FIG. 14, in an embodiment, the pre-high dielectric constant film 15p, the pre-diffusion suppressing film 17p, the pre-work function film 19p, the pre-lower electrode 21p, the pre-middle electrode 23p, the pre-upper electrode 25p, and the pre-capping pattern 27p are stacked sequentially in this order over an entire surface of the substrate 1.

The descriptions of the pre-high dielectric constant film 15p, the pre-diffusion suppressing film 17p, the pre-work function film 19p, the pre-lower electrode 21p, the pre-middle electrode 23p, the pre-upper electrode 25p, and the pre-capping pattern 27p are the same as those of the pre-high dielectric constant film 15p, the pre-diffusion suppressing film 17p, the pre-work function film 19p, the pre-lower electrode 21p, the pre-middle electrode 23p, the pre-upper electrode 25p, and the pre-capping pattern 27p provided with reference to FIG. 6.

Figure 15:
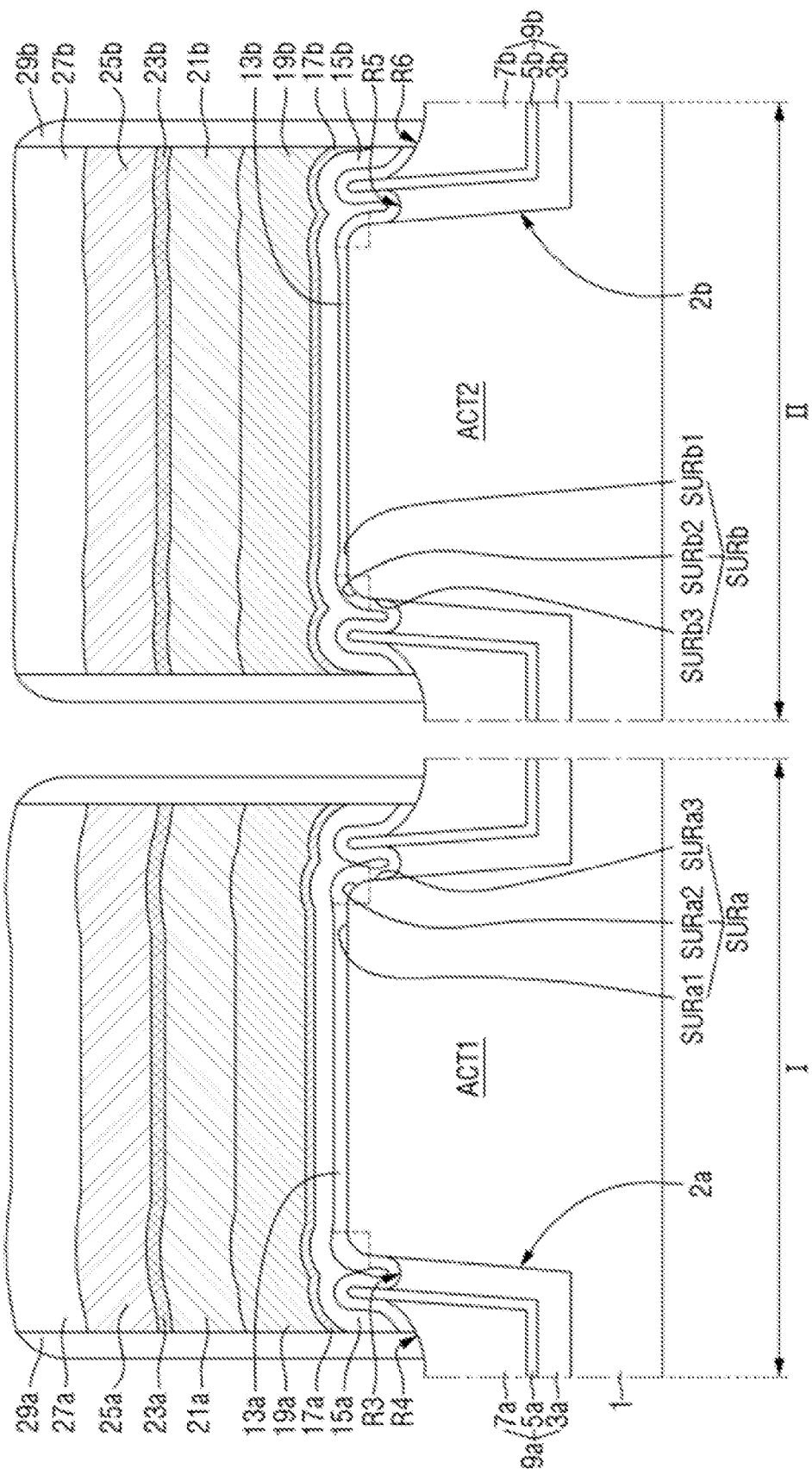

Referring to FIG. 15, in an embodiment, the first pre-gate insulating film 13pa, the pre-high dielectric constant film 15p, the pre-diffusion suppressing film 17p, the pre-work function film 19p, the pre-lower electrode 21p, the pre-middle electrode 23p, the pre-upper electrode 25p, and the pre-capping pattern 27p on the substrate 1 in the first region I are patterned to form a first gate insulating film 13a, a first high dielectric constant film 15a, a first diffusion suppressing film 17a, a first work function film 19a, a first lower electrode 21a, a first middle electrode 23a, a first upper electrode 25a and a first-capping pattern 27a, respectively.

The first gate insulating film 13a, the first high dielectric constant film 15a, the first diffusion suppressing film 17a, the first work function film 19a, the first lower electrode 21a, the first middle electrode 23a, the first upper electrode 25a and the first capping pattern 27a form a high-voltage transistor.

The second pre-gate insulating film 13pb, the pre-high dielectric constant film 15p, the pre-diffusion suppressing film 17p, the pre-work function film 19p, the pre-lower electrode 21p, the pre-middle electrode 23p, the pre-upper electrode 25p, and the pre-capping pattern 27p on the substrate 1 in the second region II are patterned to form a second gate insulating film 13b, a second high dielectric constant film 15b, a second diffusion suppressing film 17b, a second work function film 19h, a second lower electrode 21b, a second middle electrode 23b, a second upper electrode 25h, and a second capping pattern 27b, respectively.

The second gate insulating film 13b, the second high dielectric constant film 15b, the second diffusion suppressing film 17b, the second work function film 19b, the second lower electrode 21b, the second middle electrode 23b, the second upper electrode 25b and the second capping pattern 27b form a low-voltage transistor.

The first gate insulating film 13a includes the same material as the first pre-gate insulating film 13pa. The second gate insulating film 13b includes the same material as the second pre-gate insulating film 13pb. Each of the first high dielectric constant film 15a and the second high dielectric constant film 15b includes the same material as the pre-high dielectric constant film 15p. Each of the first diffusion suppressing film 17a and the second diffusion suppressing film 17b includes the same material as the pre-diffusion suppressing film 17p. Each of the first work function film 19a and the second work function film 19b includes the same material as the pre-work function film 19p. Each of the first lower electrode 21a and the second lower electrode 21b includes the same material as the pre-lower electrode 21p. Each of the first middle electrode 23a and the second middle electrode 23b includes the same material as the pre-middle electrode 23p. Each of the first upper electrode 25a and the second upper electrode 25b includes the same material as the pre-upper electrode 25p. Each of the first capping pattern 27a and the second capping pattern 27b includes the same material as the pre-capping pattern 27p.

A first gate spacer 29a is formed on sidewalls of the first gate insulating film 13a the first high dielectric constant film 15a, the first diffusion suppressing film 17a, the first work function film 19a, the first lower electrode 21a, the first middle electrode 23a, the first upper electrode 25a and the first capping pattern 27a. The first gate spacer 29a is formed on the first buried insulating film 7a. In an embodiment, the first gate spacer 29a is formed on the first upper surface SURa1 of the substrate 1 in the first region I.

A second gate spacer 29b is formed on sidewalk of the second gate insulating film 13b, the second high dielectric constant film 15b, the second diffusion suppressing film 17b, the second work function film 19b, the second lower electrode 21b, the second middle electrode 23b, the second upper electrode 25b and the second capping the pattern 27b. The second gate spacer 29b is formed on the second buried insulating film 7b. In an embodiment, the second gate spacer 29b is formed on the second upper surface SURb1 of the substrate 1 in the second region II.

Each of the first gate spacer 29a and the second gate spacer 29b includes an insulating material. Each of the first gate spacer 29a and the second gate spacer 29b includes, for example, one of silicon oxide or silicon nitride. However, embodiments of the disclosure are not necessarily limited thereto.

FIG. 16 to FIG. 30 illustrate intermediate steps of a method for manufacturing a semiconductor memory device according to an embodiment of the present disclosure. For convenience of illustration, the following descriptions focus on differences from those as described with reference to FIG. 1 to FIG. 15.

Figure 16:
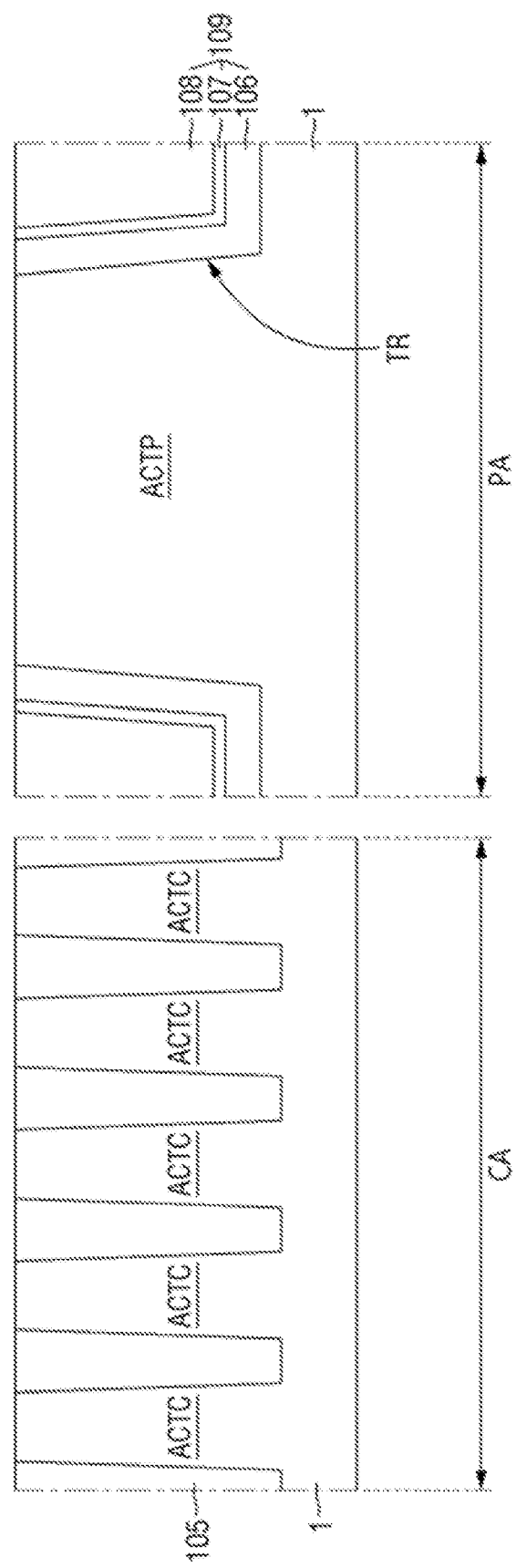

Referring to FIG. 16, in an embodiment, the substrate 1 is provided that includes a cell array region CA and a peripheral region PA is provided.

A cell active area AC TC is formed by forming a cell element isolation film 101 in in the cell array region CA of the substrate 1. A peripheral active area ACTP is formed by forming a peripheral element isolation film 109 in the peripheral region PA of the substrate 1. The cell element isolation film 105 defines a cell active area ACTC, while the peripheral element isolation film 109 defines a peripheral active area ACTP.

In addition, a word-line (WL of FIG. 31) is formed in the cell array region CA. The word-line is buried in the cell array region CA of the substrate 1 and extends in one direction. In the cell array region CA, an ion implantation process is performed to form a doped area in the cell active area ACTC. During the ion implantation process, the peripheral region PA is covered with a mask.

The peripheral element isolation film 109 includes a first peripheral liner 106, a second peripheral liner 107, and a peripheral buried insulating film 108.

The first peripheral liner 106 is conformally formed along and on an inner sidewall and a bottom surface of a peripheral trench FR. The peripheral buried insulating film 108 fills the peripheral trench TR. The second peripheral liner 107 is interposed between the first peripheral liner 106 and the peripheral buried insulating film 108. Each of the first peripheral liner 106 and the peripheral buried insulating film 108 includes silicon oxide. The second peripheral liner 107 includes silicon nitride. However, embodiments of the present disclosure are not necessarily limited thereto.

Figure 17:
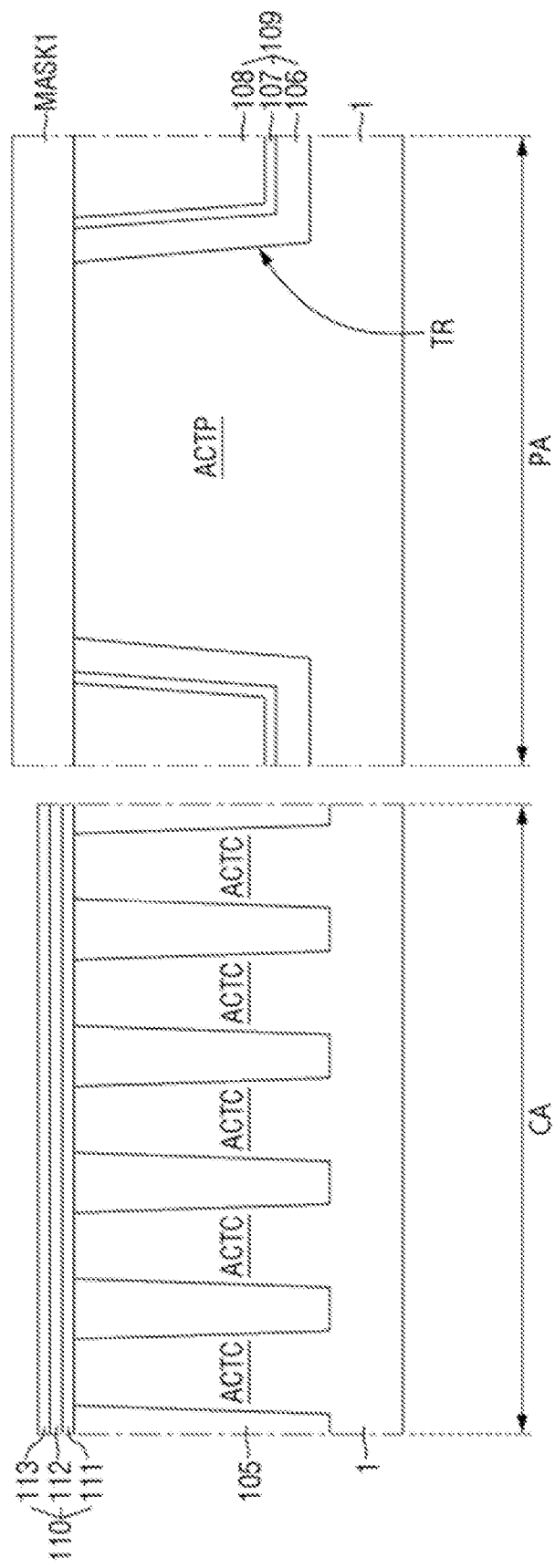

Referring, to FIG. 17, in an embodiment, a cell buffer film 110 is formed on the cell array region CA of the substrate 1.

The peripheral region PA is covered with a first mask film MASK1. The first mask film MASK1 is composed of, for example, at least one of ACL (Amorphous Carbon Layer), SOH (Spin on Hardmask), SOC (Spin on Carbon) or a silicon nitride film.

A first cell insulating film 111, a second cell insulating film 112, and a third cell insulating film 113 are sequentially stacked on the cell array region CA of the substrate 1 and are patterned to form the cell buffer film 110 on the cell array region CA. The second cell insulating film 112 includes a material that is etch selective with respect to each of the first cell insulating film 111 and the third cell insulating film 113. For example, the second cell insulating film 112 includes silicon nitride. Each of the first and third cell insulating films 111 and 113 includes silicon oxide.

Figure 18:
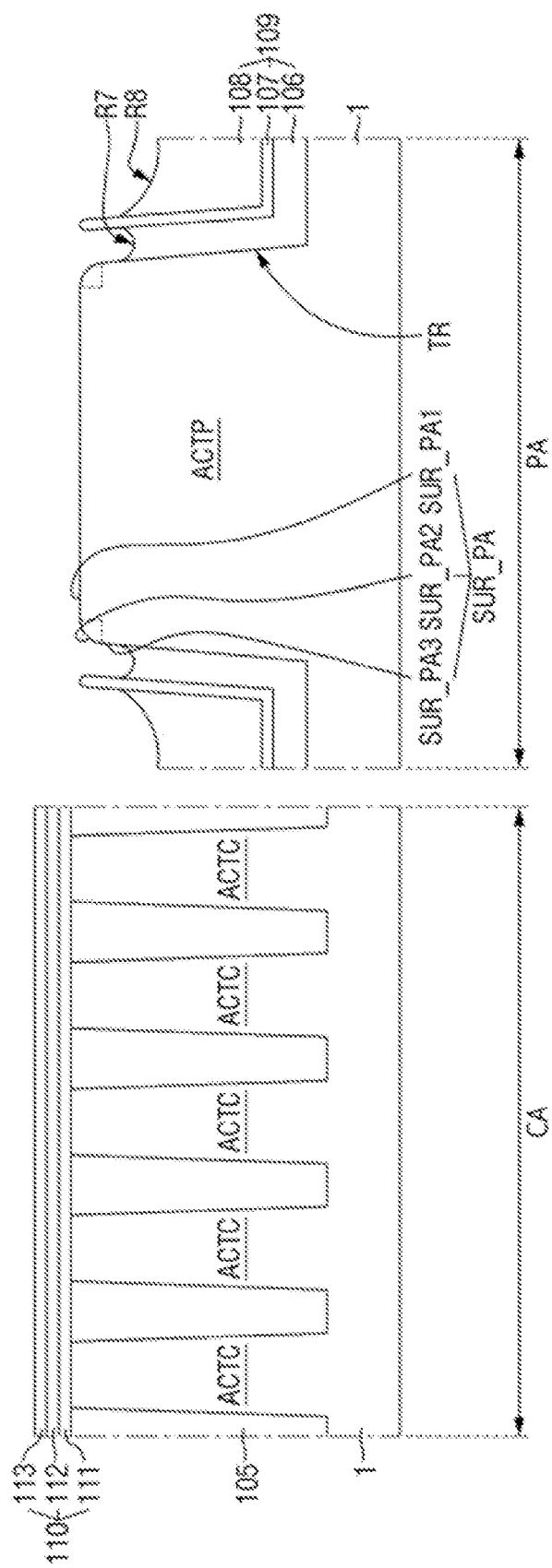

Referring to FIG. 18, in an embodiment, the first mask film MASK2 that covers the peripheral region PA is removed.

A surface of the peripheral element isolation film 109 is exposed by removing the first mask film MASK2, When removing the first mask film MASK1, a seventh recess R7 and an eighth recess R8 are formed. In some embodiments, the eighth recess R8 is deeper than the seventh recess R7. Since a width of the peripheral buried insulating film 108 is greater than a width of the first peripheral liner 106, the peripheral buried insulating film 108 is recessed to a larger amount than the first peripheral liner 106.

When removing the first mask film. MASK1, a third surface SUR_PA in the peripheral region PA of the substrate 1 is exposed. For example, a corner portion and a side surface in the peripheral region PA of the substrate 1 are exposed.

For example, the third surface SUR_PA includes a first portion SUR_PA1, second portion SUR_PA2, and a third portion SUR_PA3.

The first portion SUR_PA1 of the third surface SUR_PA is a third upper surface in the peripheral region PA of the substrate 1. The second portion SUR_PA2 of the third surface SUR_PA is a third corner portion in the peripheral region PA of the substrate 1. The third portion SUR_PA3 of the third surface SUR_PA is a third side surface in the peripheral region PA of the substrate 1. As a portion in the peripheral region PA of the substrate 1 is removed when removing the first mask film MASK1, the third corner portion SUR_PA2 in the peripheral region PA of the substrate 1 is exposed. As the seventh recess R7 is formed when removing the first mask film MASK1, the third side surface SUR_PA3 in the peripheral region PA of the substrate 1 is exposed.

Figure 19:
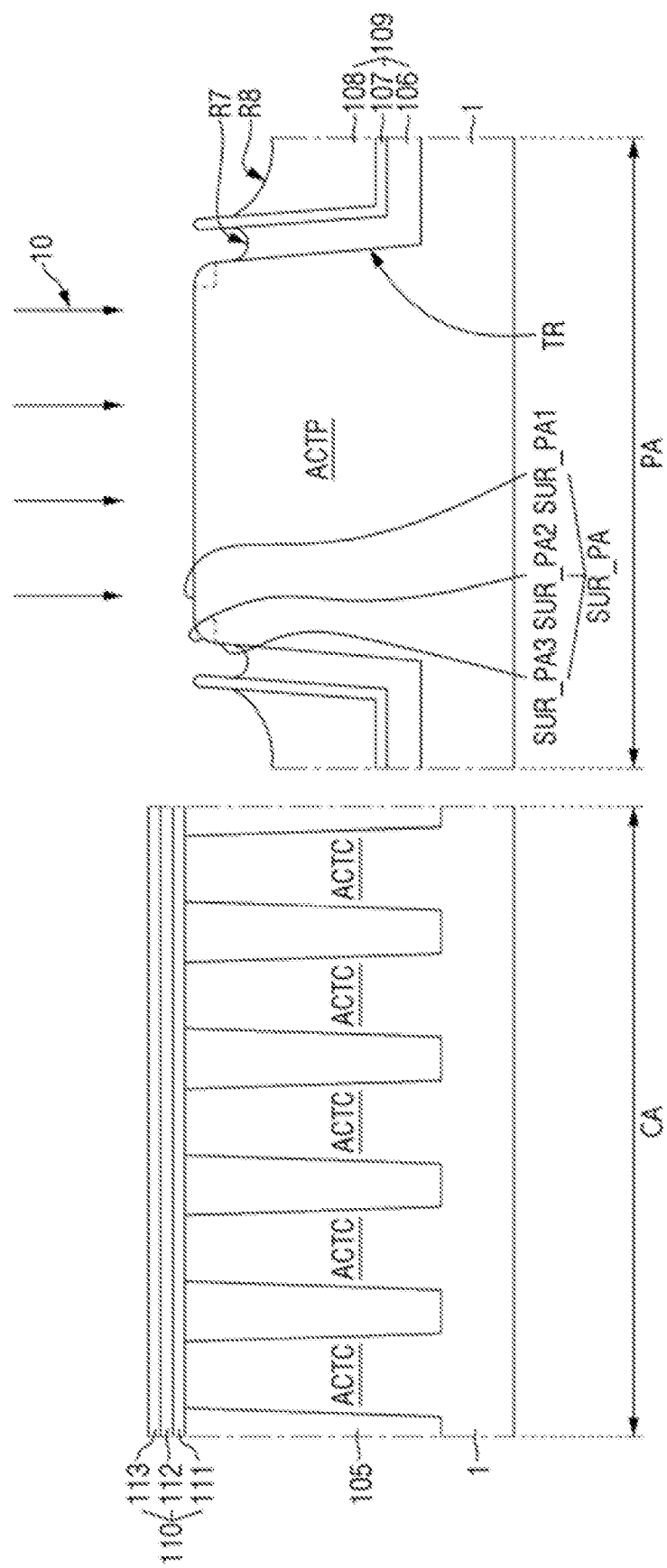

Referring to FIG. 19, in an embodiment, nitrogen (N) 10 is doped onto the peripheral region PA of the substrate 1. Nitrogen (N) is doped onto the third upper surface SUR_PA1 of the peripheral region PA of the substrate 1. In some embodiments, nitrogen is doped with an energy of 1 keV or greater and 10 keV or less. Nitrogen is doped at a dose of 1E+14/cm$^3$ or greater and 1E+16/cm$^3$ or less. However, embodiments of the present disclosure are not necessarily limited thereto.

Figure 20:
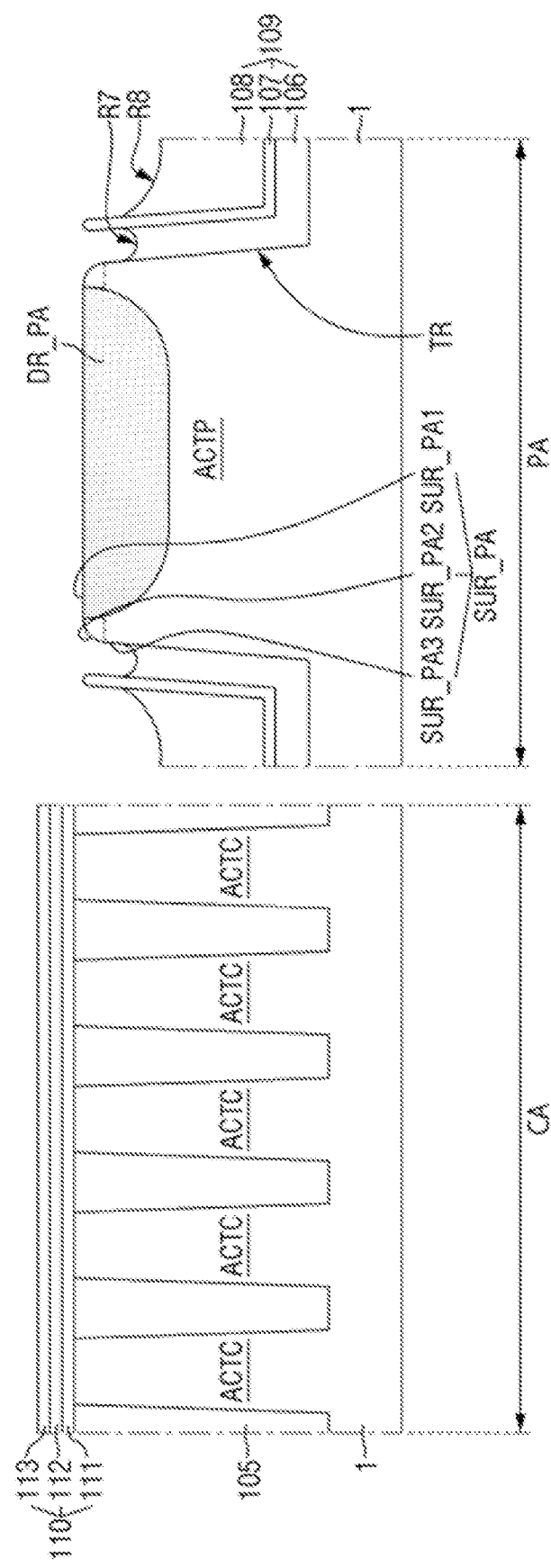

Referring to FIG. 20, in an embodiment, a peripheral doped area DR_PA is formed by doping the nitrogen (N) on the peripheral region PA of the substrate 1.

The peripheral doped area DR_PA includes nitrogen N). In the peripheral doped area DR_PA, silicon (Si) and nitrogen (N) bind to each other.

Since a description of the peripheral doped area DR_PA is substantially the same as that of the doped area DR of FIG. 3, a repeated description thereof will be omitted.

Figure 21:
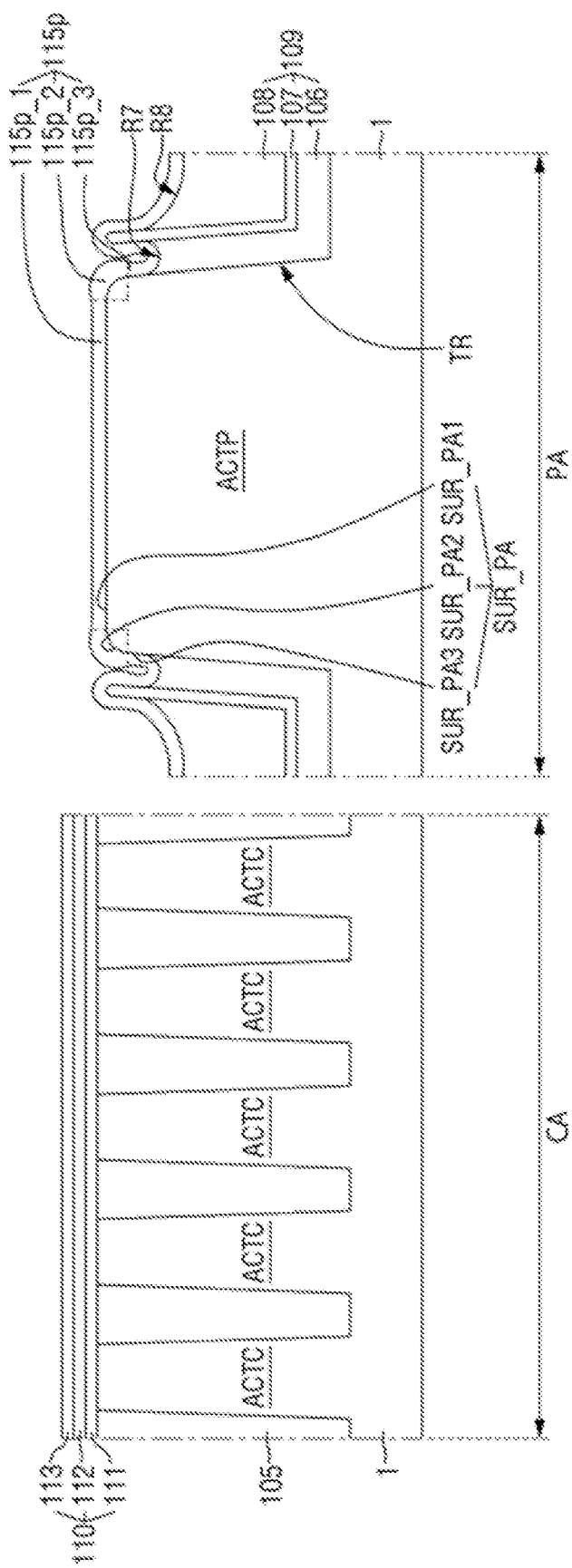

Referring to FIG. 21, in an embodiment, a pre-peripheral gate insulating film 115$p$ is formed on the third surface SUR_PA in the peripheral region PA of the substrate 1. The pre-peripheral gate insulating film 115$p$ corresponds to the pre-gate insulating film 13$p$ in FIG. 4.

The pre-peripheral gate insulating film 115$p$ is formed along and on the third upper surface SUR_PA1 in the peripheral region PA of the substrate 1, the third corner portion SUR_PA2 in the peripheral region PA of the substrate 1, the third side surface SUR_PA; in the peripheral region PA of the substrate 1, an upper surface of the first peripheral liner 106, a profile of the second peripheral liner 107, and an upper surface of the peripheral buried insulating film 108.

The pre-peripheral gate insulating film 115$p$ is formed by a thermal oxidation process or a deposition process. In addition, the third surface SUR_PA in the peripheral region PA of the substrate 1 is cleaned before the pre-peripheral gate insulating film 115$p$ is formed. When cleaning the third surface SUR_PA in the peripheral region PA of the substrate 1, the surfaces of the peripheral element isolation film 9 or the third surfaces SUR_PA in the peripheral region PA of the substrate 1 are partially etched.

When forming the pre-peripheral gate insulating film 115$p$, nitrogen (N) buried in the peripheral region PA of the substrate 1 can diffuse. Accordingly, when forming the pre-peripheral gate insulating film 115$p$, the peripheral doped area DR_PA is removed. The pre-peripheral gate insulating film 115p includes at least one of silicon oxide, silicon oxy nitride, or a combination thereof.

The pre-peripheral gate insulating film 115p includes a first portion 115p_1, a second portion 115p_2, and a third portion 115p_3. The first portion 115p_1 of the pre-gate insulating film 115p extends along and on the third upper surface SUR_PA1 in the peripheral region PA of the substrate 1. The second portion 115p_2 of the pre-peripheral gate insulating film 115p extends along and on the third corner portion SUR_PA2 in the peripheral region PA of the substrate 1. The third portion 115p_3 of the pre-peripheral gate insulating film 115p is a remaining, portion thereof that excludes the first portion 115p_1 and the second portion 115p_2.

In an embodiment, a thickness of the first portion 115p_1 of the pre-peripheral gate insulating film 115p is less than a thickness of the second portion 115p_2 of the pre-peripheral gate insulating film 115p. The description of the thickness of the pre-peripheral gate insulating film 115p is the same as the description of the thickness of the pre-gate insulating film 13p made with reference to FIG. 5 and thus a repeated description is omitted.

Figure 22:
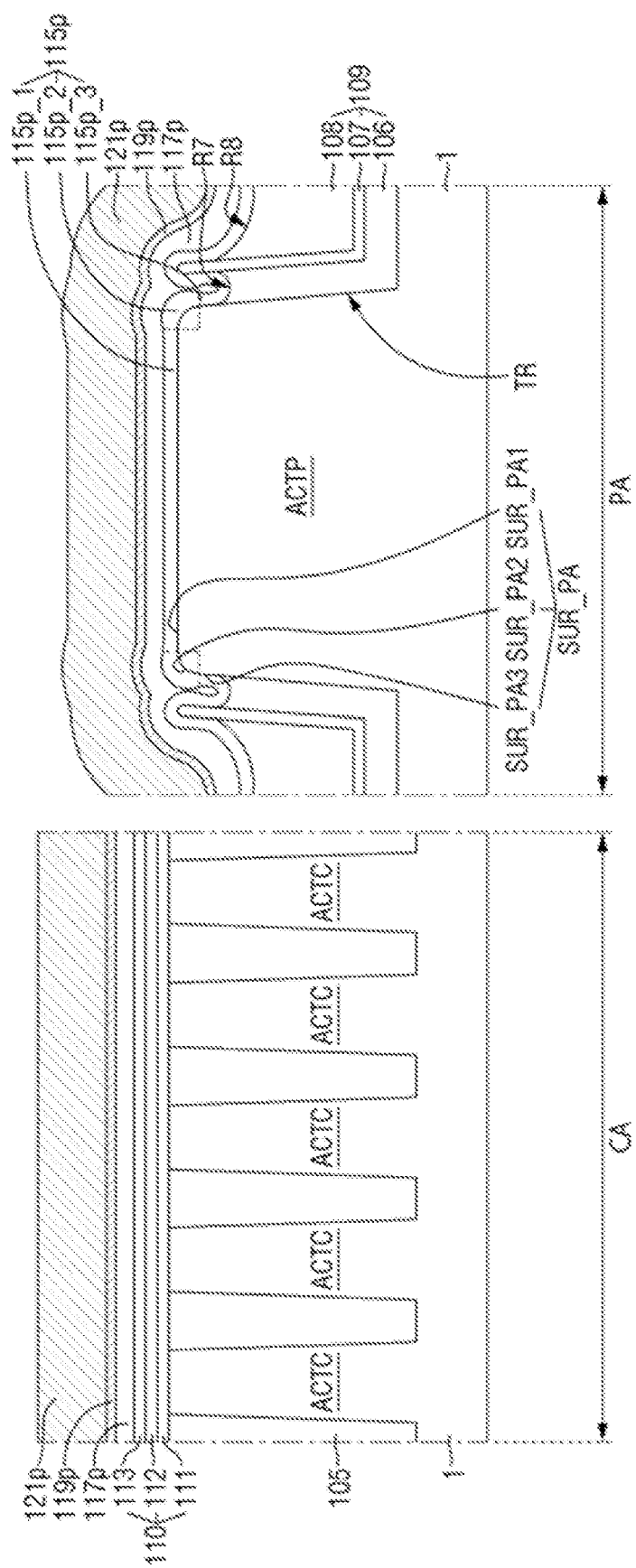

Referring to FIG. 22, in an embodiment, a pre-peripheral high dielectric constant film 117p, a pre-peripheral diffusion suppressing film 119p, and a pre-peripheral work function film 121p are sequentially stacked over an entire surface of the substrate 1.

The pre-peripheral high dielectric constant film 117p, the pre-peripheral diffusion suppressing film 119p, and the pre-peripheral work function film 121p respectively correspond to the pre-high dielectric constant film 15p, the pre-diffusion suppressing film 17p, and the pre-work function film 19p described with reference to FIG. 6.

The pre-peripheral high dielectric constant film 117p is formed by a deposition process such as CVD (Chemical Vapor Deposition) or ALD (Atomic Layer Deposition). The pre-peripheral high dielectric constant film 117p includes a material that has a higher dielectric constant than the pre-peripheral gate insulating film 115p. For example, the pre-peripheral high dielectric constant film 117p includes, but is not necessarily limited to, hafnium oxide.

The pre-peripheral diffusion suppressing film 119p includes, for example, titanium nitride (TiN). The pre-peripheral work function film 121p includes, for example, at least one of lanthanum (La), lanthanum oxide (LaO), magnesium (Mg), magnesium oxide (MgO), tantalum (Ta), tantalum nitride (TaN), or niobium (Nb). However, embodiments of the present disclosure are not necessarily limited thereto.

Figure 23:
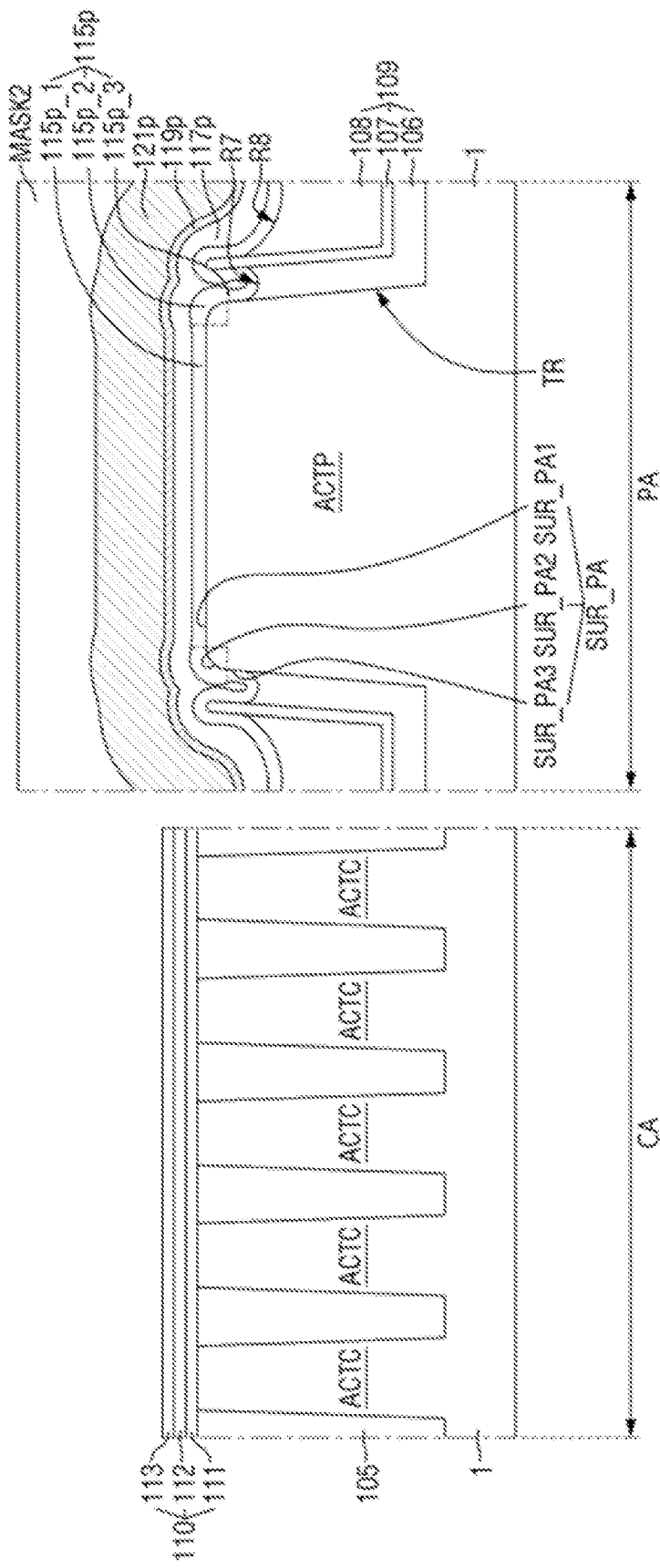

Referring to FIG. 23, in an embodiment, a second mask film MASK2 is formed that covers the peripheral region PA of the substrate 1 and exposes the cell array region CA of the substate 1. The second mask film MASK2 includes at least one of ACL (Amorphous Carbon Layer), SOH (Spin on Hardmask), SOC (Spin on Carbon), or a silicon nitride film.

Subsequently, an etching process is performed using the second mask film MASK2 as an etching mask. With the etching process, the pre-peripheral work function film 121p, the pre-peripheral diffusion suppressing film 119p, and the pre-peripheral high dielectric constant film 117p in the cell array region CA are removed from the cell array region CA of the substate 1. The etching process is a wet etching process that uses an etchant that includes sulfuric acid. The pre-peripheral work function film 121p, the pre-peripheral diffusion suppressing film 119p, and the pre-peripheral high dielectric constant film 117p are selectively removed by the wet etching process. The pre-peripheral work function film 121p, the pre-peripheral diffusion suppressing film 119p, and the pre-peripheral high dielectric constant film 117p are selectively formed in the peripheral region PA.

Figure 24:
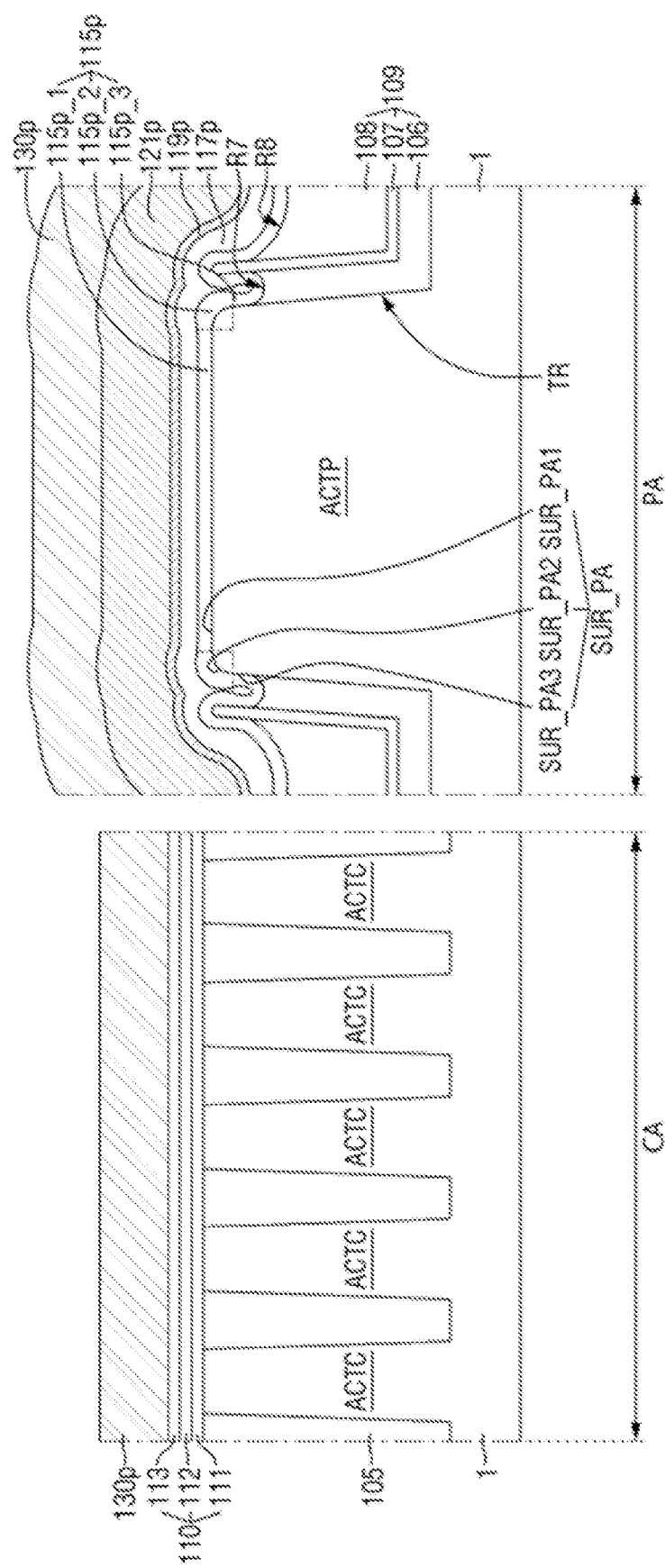

Referring to FIG. 24, in an embodiment, the second mask film MASK2 is removed. The cell array region CA and the peripheral region PA are exposed.

The cell buffer film 110 in the cell array region CA and the pre-peripheral work function film 121p in the peripheral region PA may be exposed. A lower electrode film 130p is formed over an entire surface of the substrate 1. The lower electrode film 130p is composed of a polysilicon film doped with impurities. For example, the polysilicon film is deposited over an entire surface of the substrate 1 and an ion implantation process is performed multiple times. With the ion implantation process, the polysilicon film in the cell array region CA and the peripheral region PA may be doped with N-type or P-type impurities.

Figure 25:
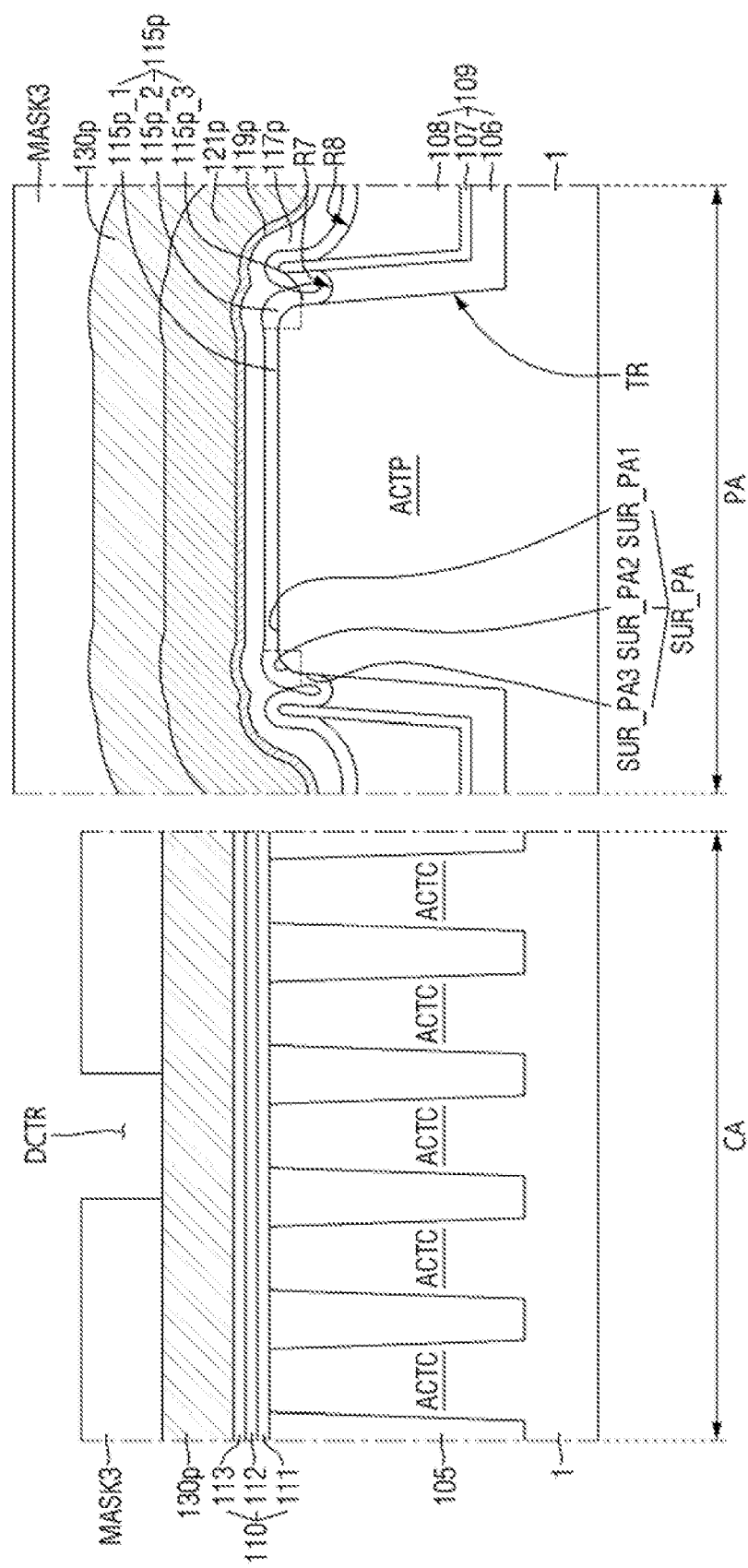
Figure 26:
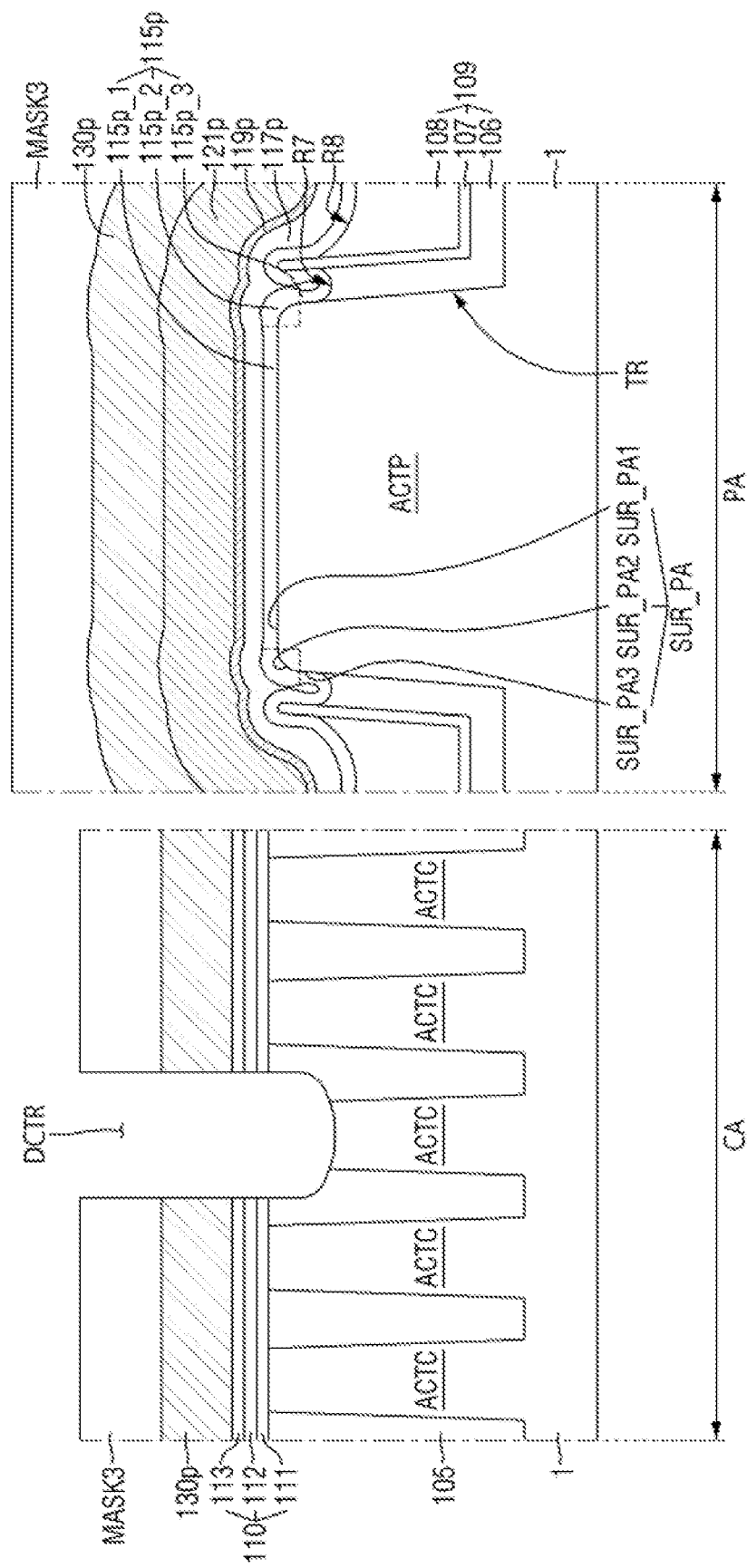

Referring to FIG. 25 and FIG. 26, in an embodiment, a third mask film MASK3 is formed on the lower electrode film 130p.

Figure 30:
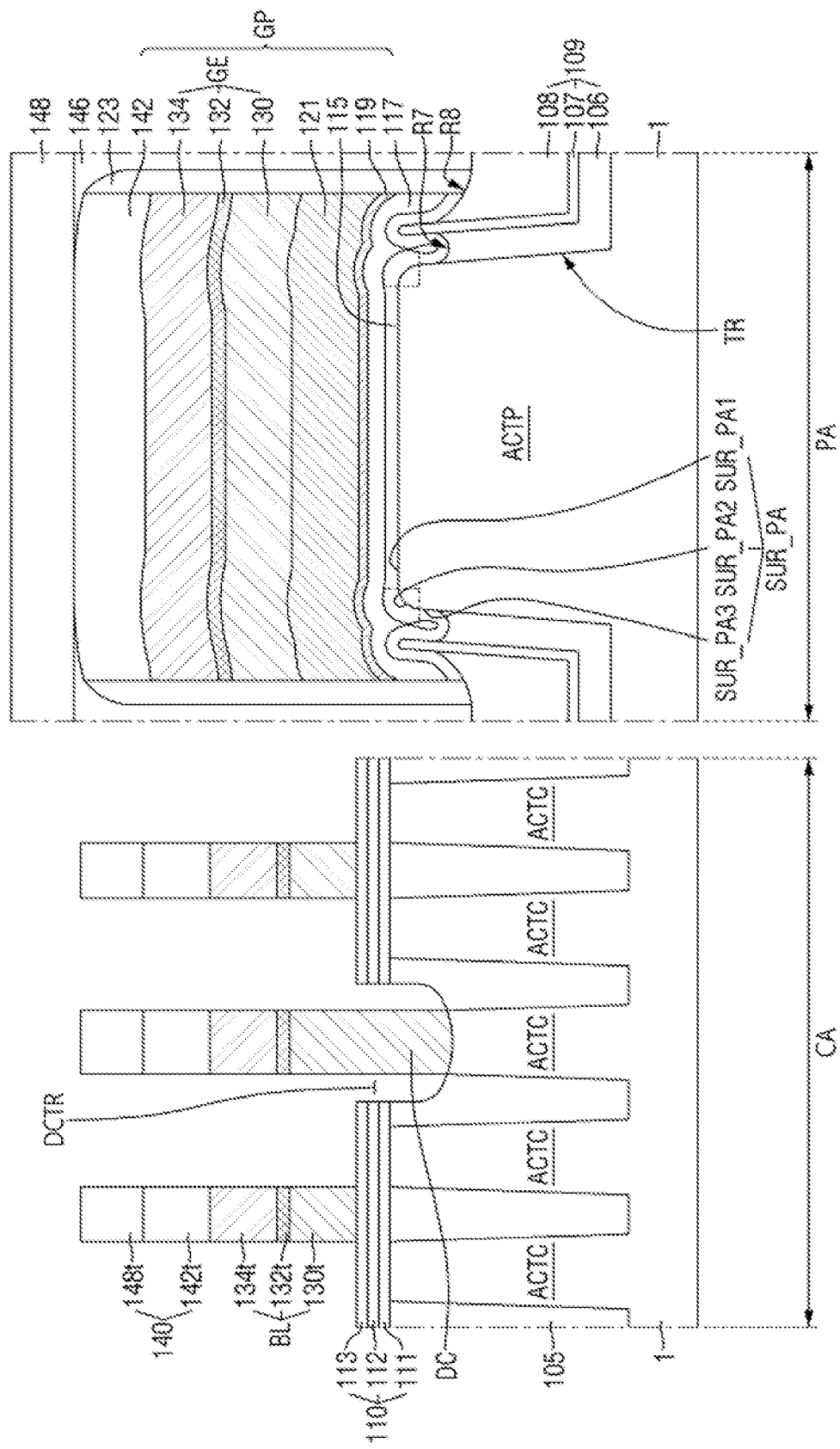

The third mask film MASK3 has an opening that roughly specifies a location of a direct contact DC (see FIG. 30). The third mask film MASK3 includes, for example, at least one of a photoresist film, ACL, SOH, or SOC. A direct contact trench DCTR is formed by partially etching the lower electrode film 130p, the cell buffer film 110, and the substrate 1 in the cell array region CA using the third mask film MASKS as an etching mask. In this regard, a top portion of the cell element isolation film 105 is partially removed.

Figure 27:
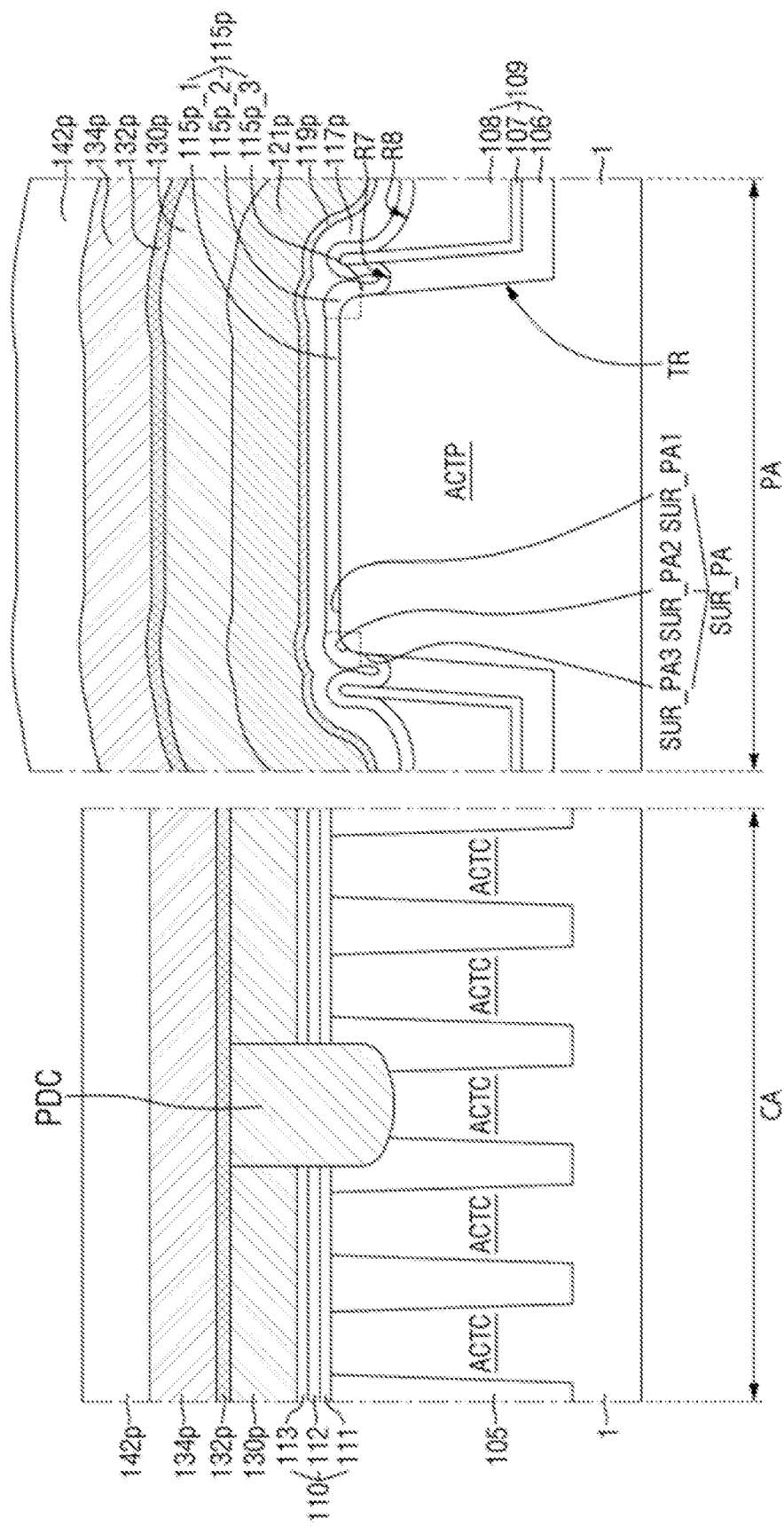

Referring to FIG. 27, in an embodiment, an upper surface of the lower electrode film 130p is exposed by removing the third mask film MASK3.

A polysilicon film doped with impurities is deposited over an entire surface of the substrate 1 and fills the direct contact trench DCTR. Then, a CMP process is performed that removes the polysilicon film from the lower electrode film 130p, thereby forming a pre-direct contact PDC.

A middle electrode film 132p, an upper electrode film 134p, and a first capping film 142p are sequentially stacked on an entire surface of the lower electrode film 130p and the pre-direct contact PDC. The middle electrode layer 132p is made of, for example, TiSiN. The upper electrode layer 134p is made of, for example, tungsten. The first capping layer 142p is made of, for example, silicon nitride.

Referring to FIG. 28, in an embodiment, a peripheral capping pattern 142 is formed by patterning the first capping layer 142p in the peripheral region PA using a mask. The upper electrode film 134p, the middle electrode film 132p, and the lower electrode film 130p in the peripheral region PA are patterned to form a peripheral gate electrode GE. The peripheral gate electrode GE includes a peripheral lower electrode 130, a peripheral middle electrode 132, and a peripheral upper electrode 134.

The upper electrode film 134p, the middle electrode film 132p, the lower electrode film 130p, the pre-peripheral work function film 121p, the pre-peripheral diffusion suppressing film 119p, the pre-peripheral high dielectric constant film 117p, and the pre-peripheral gate insulating film 115p are patterned to form a peripheral gate pattern GP. The peripheral gate pattern GP includes a peripheral gate insulating film 115, a peripheral high dielectric constant film 117, a peripheral diffusion suppressing film 119, a peripheral work function film 121, a peripheral lower electrode 130, a peripheral middle electrode 132, a peripheral upper electrode 134 and a peripheral capping pattern 142.

In addition, an N-type impurity or a P-type impurity is doped into a portion of the substrate 1 adjacent to the peripheral gate pattern GP. Thus, a source/drain area is formed adjacent to the peripheral gate pattern GP.

A peripheral spacer 123 is formed along and on the sidewall of the peripheral gate pattern GP. In the peripheral region PA, a spacer film is conformally formed. The peripheral spacer 123 is formed by etching the spacer film. The peripheral spacer 123 includes, for example, silicon oxide or silicon nitride. However, embodiments of the disclosure are not necessarily limited thereto.

Figure 29:
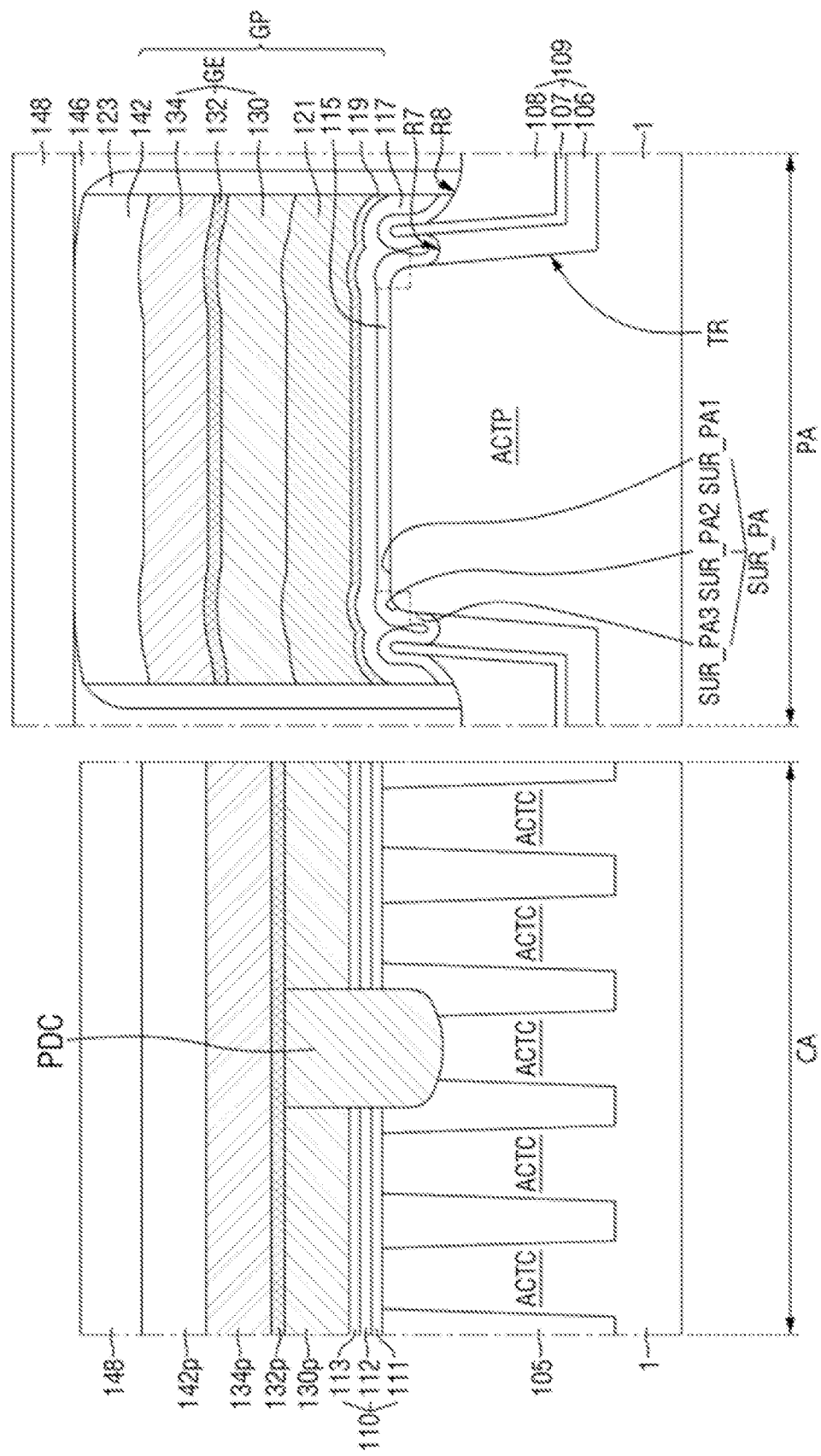

Referring to FIG. 29, in an embodiment, a peripheral interlayer insulating film 14t may be formed on and along side of the peripheral spacer 123 and on the peripheral capping pattern 142. A CMP process is performed that exposes an upper surface of the peripheral capping pattern 142.

A second capping layer 148 is formed over the entire surface of the substrate 1.

Referring to FIG. 30, in an embodiment, the second capping film 148, the first capping film 142p, the upper electrode film 134p, the middle electrode film 132p, and the lower electrode film 130p in the cell array region CA are patterned using a mask to form a bit-line capping pattern 140 and a bit-line BL.

In this regard, the pre-direct contact PDC is patterned to form the direct contact DC. A portion of a sidewall and a bottom surface of the direct contact trench DCTR are exposed. Since the cell buffer film 110 has a triple-layer structure that includes the first to third cell insulating film 111, 112, and 113, the etching process can be easily controlled.

The bit-line BL includes a bit-line lower electrode 130t, to bit-line middle electrode 132t, and a bit-line upper electrode 134t that are sequentially stacked. The bit-line lower electrode 130t includes poly silicon doped with impurities. The bit-line middle electrode 132t includes TiSiN. The bit-line upper electrode 134t includes tungsten (W). However, embodiments of the present disclosure are not necessarily limited thereto.

The bit-line capping pattern 140 includes a first bit-line capping pattern 142t and a second bit-line capping pattern 148t Each of the first bit-line capping pattern 142t and the second bit-line capping pattern 148t includes silicon nitride.

Figure 31:
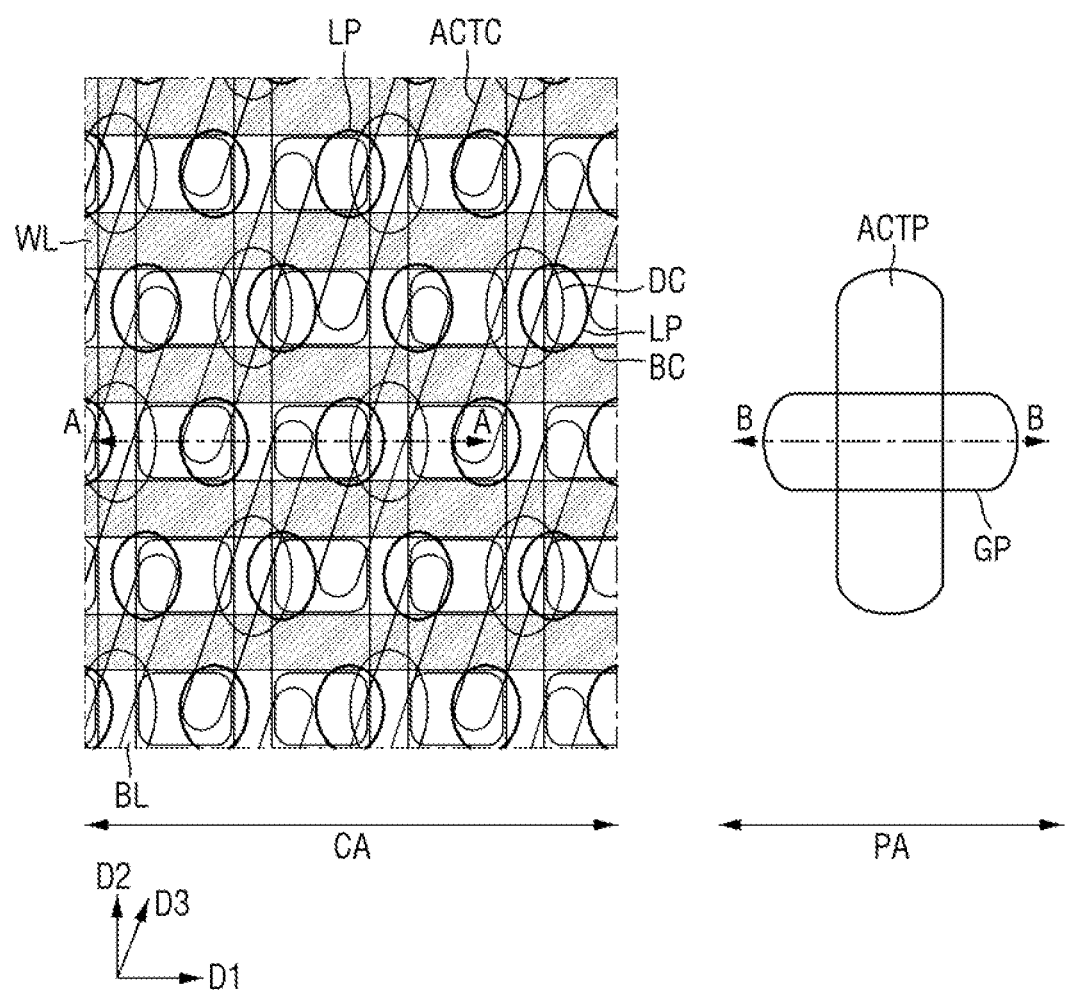
FIG. 31 is a layout diagram of a semiconductor memory device manufactured using a method for manufacturing a semiconductor memory device according to some embodiments.
Figure 32:
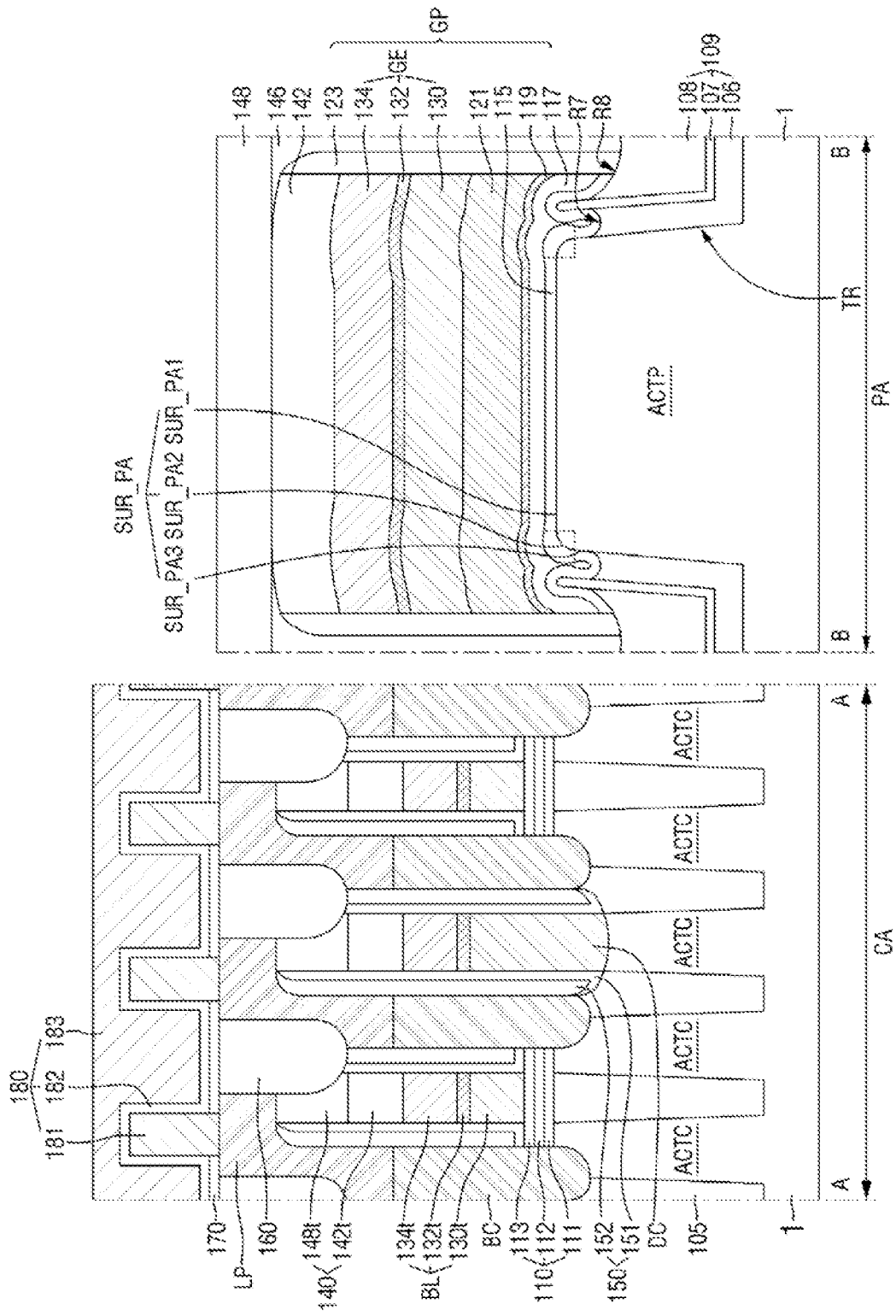
FIG. 32 is a cross-sectional view taken along lines A-A and B-B of FIG. 31.

FIG. 31 is a layout diagram of a semiconductor memory device manufactured using a method for manufacturing a semiconductor memory device according to some embodiments. FIG. 32 is a cross-sectional view taken along lines A-A and B-B of FIG. 31. For reference, a semiconductor memory device of FIG. 31 and FIG. 32 corresponds to a semiconductor memory device manufactured as illustrated by FIG. 16 to FIG. 30.

Referring to FIG. 31 and FIG. 32, in an embodiment, the substrate 1 is provided that includes the cell array region CA and the peripheral region PA.

The peripheral region PA is disposed around the cell array region CA. Word-lines WL are disposed in the cell array region CA and peripheral circuits that drive the bit-lines BL are disposed in the peripheral region PA. For example, at least one of an NMOS high-voltage transistor, an NMOS low-voltage transistor, a PMOS high-voltage transistor, or a PMOS low-voltage transistor is disposed in the peripheral region PA. Further, the peripheral region PA includes at least one peripheral region PA. A NMOS transistor and a PMOS transistor are respectively disposed in each of a plurality of peripheral regions PA.

The cell element isolation film 105 is disposed in the cell array region CA of the substrate 1. As a design rule of the semiconductor memory device is reduced, the cell active area ACTC has a bar shape that extends in a diagonal line or an oblique line as shown in FIG. 31. For example, the cell active area ACTC extends in the third direction D3 that crosses the first direction D1 and the second direction D2 in a plane defined by the first and second directions D1 and D2. In this regard, the first direction D1 and the second direction D2 may be perpendicular to each other.

The cell active areas ACTC are arranged in the first direction D1. An end of one cell active area ACTC is adjacent to a center of another cell active area ACTC.

A semiconductor memory device according to some embodiments includes various contact arrangements formed on the cell active area ACTC. The various contact arrangements include, for example, the direct contact DC, a buried contact BC, and a landing pad LP.

The direct contact DC electrically connects the cell active area ACTC to the bit-line BL. The buried contact BC connects the cell active area ACTC to a capacitor lower electrode 181. In an embodiment, a contact area between the buried contact BC and the cell active area ACTC is small. Accordingly, the conductive landing pad LP increases a contact area with the capacitor lower electrode 181 and increases a contact area with the cell active area ACTC.

The landing pad LP is positioned between the cell active area. ACTC and the buried contact BC and between the buried contact BC and the capacitor lower electrode 181. In a semiconductor memory device according to some embodiments, the landing pad LP is disposed between the buried contact BC and the capacitor lower electrode 181. Increasing the contact area by the introduction of the landing pad LP reduces a contact resistance between the cell active area ACTC and the capacitor lower electrode 181.

The word-lines WL are buried in the substrate 1. The word-lines WL intersect the cell active area ACTC in a plan view. The word-lines WL extend in the first direction D1. The word-lines WL are spaced apart from each other in the second direction D2. In addition, a doped area is formed in the cell active area ACTC and between the word-lines WL. The doped area is doped with N-type impurities.

The cell buffer film 110 is disposed in the cell array region CA on the substrate 1. The cell buffer film 110 includes the first cell insulating film 111, the second cell insulating film 112, and the third cell insulating film 113 that are sequentially stacked.

The bit-tines BL are disposed on the cell buffer film 110. The bit-lines BL extend across the substrate 1 and intersect the word-lines WL in a plan view. As shown in FIG. 31, the bit-lines BL extend in the second direction D2. The bit-lines BL are spaced apart from each other in the first direction D1.

The bit-line BL includes the bit-line lower electrode 130t, the bit-line middle electrode 132t, and the bit-line upper electrode 134t that are sequentially stacked.

The bit-line capping pattern 140 is disposed on the bit-line BE The bit-line capping pattern 140 includes the first bit-line capping pattern 142t and the second bit-line capping pattern 148t that are sequentially stacked.

A bit-line spacer 150 is disposed on a sidewall of the bit-line BL and a sidewall of the bit-line capping pattern 140. The bit-line spacer 150 is disposed on the cell element isolation film 105 in the substrate 1 and in an area of the bit-line BL in which the direct contact DC is formed. However, in an area in which the direct contact DC is not formed, the bit-line spacer 150 is disposed on the cell buffer film 110.

In an embodiment, the bit-line spacer 150 is a single layer. However, in an embodiment, as illustrated, the bit-line spacer 150 includes multiple layers that include first and second bit-line spacers 151 and 152. Each of the first and second bit-line spacers 151 and 152 includes one of as silicon oxide film, a silicon nitride film, a silicon oxynitride film (SON), a silicon oxycarbonitride film (SiOCN), air, or a combination thereof. However, embodiments of the disclosure are not necessarily limited thereto.

The cell buffer film 110 is interposed between the BL and the cell element isolation film 105 and between the bit-line spacer 150 and the substrate 1.

The bit-line BL is electrically connected to the doped area of the cell active area ACTC by the direct contact DC. The direct contact DC is made of, for example, polysilicon doped with impurities.

The buried contact BC is disposed between a pair of adjacent bit-lines BL. The buried contacts BC are spaced apart from each other. The buried contact BC include at least one of polysilicon doped with impurities, a conductive silicide compound, a conductive metal nitride, or a metal. The buried contacts BC have island shapes that are spaced apart from each other in a plan view. The buried contact BC extend through the cell buffer film 110 and contact the doped areas of the cell active area ACTC.

A landing pad LP is formed on the buried contact BC. The landing pad LP is electrically connected to the buried contact BC. The landing pad LP overlaps a portion of an upper surface of the bit-line BL. The landing pad LP includes, for example at least one of a semiconductor material doped with impurities, a conductive silicide compound, a conductive metal nitride, a conductive metal carbide, a metal or a metal alloy.

A pad isolation insulating film 160 is formed on the landing pad LP and the bit-line BL. For example, the pad isolation insulating film 160 is disposed on the bit-line capping pattern 140. The pad isolation insulating film 160 defines an area of the landing pad LP that forms each of a plurality of isolated areas. Further, the pad isolation insulating film 160 does not cover an upper surface of the landing pad LP. In an embodiment, an upper surface of the pad isolation insulating film 160 is coplanar with the upper surface of the landing pad LP.

The pad isolation insulating film 160 includes an insulating material that electrically insulates a plurality of landing pads LP from each other. For example, the pad isolation insulating film 160 includes, for example, at least one of a silicon oxide film, a silicon nitride film, a silicon oxynitride film, a silicon oxycarbonitride film, or a silicon carbonitride film.

An etch stop film 170 is disposed on the pad isolation insulating film 160 and the landing pad LP. The etch stop film 170 includes at least one of as silicon nitride film, a silicon carbonitride film, a silicon boron nitride film (SiBN), a silicon oxynitride film, or a oxycarbide film.

A capacitor 180 is disposed on the landing pad LP. The capacitor 180 is electrically connected to the landing pad LP. A portion of the capacitor 180 is disposed in the etch stop film 170. The capacitor 180 includes the capacitor lower electrode 181, a capacitor dielectric film 182, and a capacitor upper electrode 183.

The capacitor lower electrode 181 is disposed on the landing pad LP. The capacitor lower electrode 181 is illustrated as having a pillar shape. However, embodiments of the disclosure are not necessarily limited thereto. In an embodiment, the capacitor lower electrode 181 has a cylinder shape. The capacitor dielectric film 182 is formed on the capacitor lower electrode 181. The capacitor dielectric film 182 is formed along and on a profile of the capacitor lower electrode 181. The capacitor upper electrode 183 is formed on the capacitor dielectric film 182. The capacitor upper electrode 183 surrounds an outer sidewall of the capacitor lower electrode 181.

Each of the capacitor lower electrode 181 and the capacitor upper electrode 183 includes, for example, at least one of a doped semiconductor material, a conductive metal nitride, such as titanium nitride, tantalum nitride, niobium nitride or tungsten nitride, etc., a metal, such as ruthenium, iridium, titanium or tantalum, etc., or a conductive metal oxide, such as iridium oxide or niobium oxide, etc. However, embodiments of the disclosure are not necessarily limited thereto.

The capacitor dielectric film 182 includes, but is not limited to, one of, for example, silicon oxide silicon nitride, silicon oxynitride, a high dielectric constant material, or combinations thereof. In a semiconductor memory device according to some embodiments, the capacitor dielectric film 182 includes a stacked film structure in which films respectively made of zirconium oxide, aluminum oxide and zirconium oxide are sequentially stacked. In a semiconductor memory device accordion to some embodiments, the capacitor dielectric film 182 includes a dielectric film that includes hafnium (Hf). In a semiconductor memory device according to some embodiments, the capacitor dielectric film 182 has a stacked film structure of a ferroelectric material film and a paraelectric material film.

In concluding the detailed description, those skilled in the an will appreciate that many variations and modifications may be made to embodiments without substantially departing from the principles of embodiments of the present disclosure. Therefore, embodiments of the disclosure are used in a generic and descriptive sense only and not for purposes of limitation.

What is claimed is:

1. A method for manufacturing a semiconductor memory device, the method comprising:
providing a substrate;
etching a portion of the substrate that forms a trench therein;
forming an element isolation film that fills the trench and defines an active area, wherein the element isolation film includes a first liner that covers an inner sidewall and a bottom surface of the trench, wherein the first liner is recessed and exposes a corner portion of the substrate;
forming a doped area by doping nitrogen into the substrate; and
forming a pre-gate insulating film that extends along and on the exposed corner portion of the substrate and an upper surface of the substrate,
wherein the doped area is removed when forming the pre-gate insulating film,
wherein the pre-gate insulating film includes:
a first portion on the upper surface of the substrate; and
a second portion on the corner portion of the substrate, and
wherein a thickness of the first portion is less than a thickness of the second portion.

2. The method of claim 1, wherein a ratio of the thickness of the first portion and the thickness of the second portion is greater than 1.00 and is less than 1.20.

3. The method of claim 2, wherein the ratio of the thickness of the first portion and the thickness of the second portion is 1.01.

4. The method of claim 1, wherein the method further comprises cleaning a surface of the substrate before forming the pre-gate insulating film.

5. The method of claim 1, wherein doping nitrogen into the substrate includes doping the nitrogen with an energy in a range from 1 keV to 10 keV.

6. The method of claim 1, wherein doping nitrogen into the substrate includes doping the nitrogen at a dose in a range from $1E+14/cm^3$ to $1E+16/cm^3$.

7. The method of claim 1, wherein a depth of the doped area is less than or equal to 500 angstroms.

8. The method of claim 7, wherein a depth of the doped area is less than or equal to 50 angstroms.

9. The method of claim 1, wherein the element isolation film further includes:
- a buried insulating film that fills the trench; and
- a second liner interposed between the buried insulating film and the first liner.

10. A method for manufacturing a semiconductor memory device, the method comprising:
- providing a substrate that includes a first region and a second region;
- forming a first element isolation film that fills a first trench in the first region of the substrate and defines a first active area, wherein the first element isolation film includes a first liner that covers an inner sidewall and a bottom surface of the first trench;
- forming a second element isolation film that fills a second trench in the second region of the substrate and defines a second active area, wherein the second element isolation film includes a second liner that covers an inner sidewall and a bottom surface of the second trench;
- recessing the first liner and exposing a first corner portion in the first region of the substrate, and recessing the second liner and exposing a second corner portion in the second region of the substrate;
- doping nitrogen onto an entire surface of the substrate;
- forming a first pre-gate insulating film that extends along and on a first upper surface and the first corner portion in the first region of the substrate; and
- forming a second pre-gate insulating film that extends along and on a second upper surface and the second corner portion in the second region of the substrate,
- wherein the forming a first pre-gate insulating film and the forming a second pre-gate insulating film are distinct from each other such that a thickness of the first pre-gate insulating film is greater than a thickness of the second pre-gate insulating film,
- wherein the first pre-gate insulating film includes a first portion on the first upper surface and a second portion on the first corner portion,
- wherein a thickness of the first portion is less than a thickness of the second portion,
- wherein the second pre-gate insulating film includes a third portion on the second upper surface and a fourth portion on the second corner portion, and
- wherein a thickness of the third portion is less than a thickness of the fourth portion.

11. The method of claim 10, wherein a ratio of the thickness of the first portion and the thickness of the second portion is greater than 1.00 and is less than 1.20.

12. The method of claim 10, wherein a ratio of the thickness of the third portion and the thickness of the fourth portion is greater than 1.00 and is less than 1.20.

13. The method of claim 10, wherein the method further comprises:
- before forming the first pre-gate insulating film, cleaning a surface in the first region of the substrate; and
- before forming the second pre-gate insulating film, cleaning a surface in the second region of the substrate.

14. The method of claim 10, wherein doping nitrogen onto the entire surface of the substrate includes doping the nitrogen with an energy in a range from 1 keV to 10 keV.

15. The method of claim 10, wherein doping nitrogen onto the entire surface of the substrate includes doping the nitrogen at a dose in a range from $1E+14/cm^3$ to $1E+16/cm^3$.

16. The method of claim 10, wherein nitrogen is doped onto the entire surface of the substrate wherein a first doped area is formed in the first region of the substrate and a second doped area is formed in the second region of the substrate,
- wherein a depth of each of the first and second doped area is less than or equal to 500 Angstroms.

17. A method for manufacturing a semiconductor memory device, the method comprising:
- providing a substrate that includes a cell array region and a peripheral region;
- forming a cell element isolation film in the cell array region of the substrate, wherein the cell element isolation film defines a cell active area;
- forming a peripheral element isolation film that fills a peripheral trench in the peripheral region of the substrate, wherein the peripheral element isolation film defines a peripheral active area, wherein the peripheral element isolation film includes a peripheral liner that covers an inner sidewall and a bottom surface of the peripheral trench;
- forming a cell buffer film in the cell array region of the substrate;
- forming a peripheral doped area by doping nitrogen onto the peripheral region of the substrate;
- forming a pre-peripheral gate insulating film in the peripheral region of the substrate;
- forming a bit-line on the cell buffer film, wherein the bit-line extends across the cell array region of the substrate; and
- recessing the peripheral liner and exposing a corner portion of the peripheral region of the substrate,
- wherein the peripheral doped area is removed when forming the pre-peripheral gate insulating film,
- wherein the pre-peripheral gate insulating film includes:
- a first portion on an upper surface of the peripheral region of the substrate; and
- a second portion on the corner portion of the peripheral region of the substrate, and
- wherein a thickness of the first portion is less than a thickness of the second portion.

18. The method of claim 17, wherein a ratio of the thickness of the first portion and the thickness of the second portion is greater than 1.00 and is less than 1.20.

19. The method of claim 17, wherein doping nitrogen onto the peripheral region of the substrate includes doping the nitrogen with an energy in a range from 1 keV to 10 keV.

20. The method of claim 17, wherein doping nitrogen onto the peripheral region of the substrate includes doping the nitrogen at a dose in a range from $1E+14/cm^3$ to $1E+16/cm^3$.

* * * * *